(12) United States Patent
Clark et al.

(10) Patent No.: US 8,791,718 B2
(45) Date of Patent: Jul. 29, 2014

(54) SEQUENTIAL STATE ELEMENTS IN TRIPLE-MODE REDUNDANT (TMR) STATE MACHINES

(75) Inventors: Lawrence T. Clark, Phoenix, AZ (US); Nathan D. Hindman, Tempe, AZ (US); Dan Wheeler Patterson, Scottsdale, AZ (US)

(73) Assignee: Arizona Board of Regents for and on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 13/487,859

(22) Filed: Jun. 4, 2012

(65) Prior Publication Data

US 2012/0306535 A1   Dec. 6, 2012

Related U.S. Application Data

(60) Provisional application No. 61/492,451, filed on Jun. 2, 2011.

(51) Int. Cl.
  *H03K 19/003*  (2006.01)
(52) U.S. Cl.
  USPC .................. 326/46; 326/16; 714/724
(58) Field of Classification Search
  CPC .................................. H03K 19/0033
  USPC ............................................. 326/46
  See application file for complete search history.

(56) References Cited

U.S. PATENT DOCUMENTS

| | | | | |
|---|---|---|---|---|
| 6,104,211 A * | 8/2000 | Alfke | ............................. | 326/91 |
| 6,526,559 B2 * | 2/2003 | Schiefele et al. | ............... | 326/11 |
| 6,646,464 B2 * | 11/2003 | Maruyama | ..................... | 326/35 |
| 7,719,304 B1 * | 5/2010 | Clark et al. | ..................... | 326/14 |
| 7,904,772 B2 * | 3/2011 | Nicolaidis | ..................... | 714/724 |
| 8,161,367 B2 * | 4/2012 | Chandra | ....................... | 714/822 |
| 8,493,120 B2 * | 7/2013 | Choudhury et al. | .......... | 327/203 |
| 2014/0049286 A1 * | 2/2014 | Clark | .............................. | 326/16 |

OTHER PUBLICATIONS

Drake et al., 2005, A Self-Correcting Soft Error Tolerant Flop-Flop, 12th NASA Symposium on VLSI Design, Coeur d'Alene, Idaho, USA, Oct. 4-5, 2005.*
Lacoe, R. et al., "Application of hardness-by-design methodology to radiation-tolerant ASIC technologies," IEEE Transactions on Nuclear Science, vol. 47, No. 6, Dec. 2000, pp. 2334-2341.

(Continued)

*Primary Examiner* — Alexander H Taningco
*Assistant Examiner* — Nelson Correa
(74) *Attorney, Agent, or Firm* — Withrow & Terranova, P.L.L.C.

(57) ABSTRACT

The disclosure relates generally to triple-redundant sequential state (TRSS) machines formed as integrated circuits on a semiconductor substrate, such as CMOS, and computerized methods and systems of designing the triple-redundant sequential state machines. Of particular focus in this disclosure are sequential state elements (SSEs) used to sample and hold bit states. The sampling and holding of bits states are synchronized by a clock signal thereby allowing for pipelining in the TRSS machines. In particular, the clock signal may oscillate between a first clock state and a second clock state to synchronize the operation of the SSE according to the timing provided by the clock states.

The SSEs have a self-correcting mechanism to protect against radiation induced soft errors. The SSE may be provided in a pipeline circuit of a TRSS machine to receive and store a bit state of bit signal generated by combinational circuits within the pipeline circuit.

22 Claims, 17 Drawing Sheets

(56) References Cited

OTHER PUBLICATIONS

Calin, T. et al., "Upset Hardened Memory Design for Submicron CMOS Technology," IEEE Transactions on Nuclear Science, vol. 53, No. 6, Dec. 1996, pp. 2874-2878.

Knudsen, J. et al., "An Area and Power Efficient Radiation Hardened by Design Flip-Flop," IEEE Transactions on Nuclear Science, vol. 53, No. 6, Dec. 2006, pp. 3392-3399.

Matush, B. et al., "Area-Efficient Temporally Hardened by Design Flip-Flop Circuits," IEEE Transactions on Nuclear Science, vol. 57, No. 6, Dec. 2010, pp. 3588-3595.

Mavis, D. et al., "Soft error rate mitigation techniques for modern microcircuits," IEEE International Reliability Physics Symposium, 2002, pp. 216-225.

ACTEL Corporation, "RTAX-S/SL Rad Tolerant FPGAs," Revision 15, May 2009, 226 pages, www.actel.com/documents/RTAXS_DS.pdf.

Morgan, K. et al., "A comparison of TMR with alternative fault-tolerant design techniques for FPGAs," IEEE Transactions on Nuclear Science, vol. 54, No. 6, Dec. 2007, pp. 2065-2072.

Quinn, H. et al., "A Review of Xilinx FPGA Architectural Reliability Concerns from Virtex to Virtex-5," Radiation and Its Effects on Components and Systems (RADECS), Sep. 2007, pp. 1-8.

\* cited by examiner

SEQUENTIAL STATE ELEMENTS IN TRIPLE-MODE REDUNDANT (TMR) STATE MACHINES

RELATED APPLICATION

This application claims the benefit of provisional patent application Ser. No. 61/492,451, filed Jun. 2, 2011, the disclosure of which is hereby incorporated herein by reference in its entirety.

STATEMENT OF GOVERNMENT SUPPORT

This invention was made with government funds under contract number FA-945307-C-0186 awarded by the U.S. Air Force Research Laboratories. The U.S. Government has rights in this invention

FIELD OF THE DISCLOSURE

The disclosure relates generally to triple-mode redundant (TMR) state machines and method and systems for designing TMR state machines.

BACKGROUND

State machines built from integrated circuits need to be radioactively hardened to prevent soft errors that occur when a high energy particle travels through the integrated circuit's semiconductor substrate. This is particularly important when the state machine is to operate in high radiation environments such as outer space. An ionizing particle traveling through the semiconductor substrate may cause a transient voltage glitch, i.e., a single event transient (SET), or may cause a sequential state element to store the wrong state, i.e., a single event upset (SEU).

One technique for preventing the effects of high energy radiation is to provide a self-correcting triple-redundant (TR) circuit. In this manner, if a radiation strike results in a soft error in one copy of the circuit, the other two copies of the circuit can correct the soft error in the affected copy of the circuit through self-correction techniques. However, charge collection can affect multiple circuit nodes, requiring the critical nodes of redundant circuits to be spatially separated so that one ionizing track does not affect multiple circuit nodes, thereby defeating the self-correcting mechanism of the redundancy.

Triple-mode redundancy (TMR) has been used extensively in many state machines, such as Field Programmable Gate Arrays (FPGAs). Unfortunately, the arrangement and functionality of these circuits has proven inadequate in high radiation environments. In particular, these FPGAs suffer from "domain crossing" errors where charge collection can affect multiple circuit copies, thwarting TMR correction. It is thus essential that a logic design methodology aimed at application specific integrated circuits (ASICs) guarantee an adequate minimum spatial separation of critical nodes, which is difficult since standard CAD software, whether aimed at FPGAs or ASICs, attempts to minimize delay and power by placing logic nodes as close to each other as possible.

Accordingly, what is needed are more robust radiation hardened integrated circuit configurations and techniques to design radiation hardened integrated circuits.

SUMMARY

The disclosure relates generally to triple-redundant sequential state (TRSS) machines formed as integrated circuits on a semiconductor substrate, such as Complementary Metal-Oxide Semiconductor (CMOS), and computerized methods and systems of designing the TRSS machines. Of particular focus in this disclosure are sequential state elements (SSEs) used to sample and hold bit states. The sampling and holding of bit states are synchronized by a clock signal, thereby allowing for pipelining in the TRSS machines. In particular, the clock signal may oscillate between a first clock state and a second clock state to synchronize the operation of the SSE according to the timing provided by the clock states. The SSE has a self-correcting mechanism to protect against radiation-induced soft errors. The SSE may be provided in a pipeline circuit of a TRSS machine to receive and store a bit state of a bit signal generated by combinational circuits within the pipeline circuit.

In one embodiment, the SSE includes a sampling stage and a feedback stage. While the clock signal is in the first clock state, the sampling stage samples an input bit signal to generate an output bit signal having an output bit state. In this example, an input bit state of the input bit signal is being captured during the first clock state since the output bit state is provided in accordance with the input bit state. The SSE also includes a feedback stage configured to drive the output bit state of the output bit signal while the clock signal is in the second clock state. The feedback stage thus allows for the SSE to hold the output bit state so that the output bit state can be processed by downstream combination logic in the pipeline circuit.

The feedback stage is operable in at least two feedback modes to hold the output bit state during the second clock state of the clock signal. In a first feedback mode, the output bit state of the output bit signal is held as provided from the sampling stage. Consequently, the output bit state is held at whatever bit state was provided from the sampling stage. The first feedback mode is not a self-correcting mode since errors in the output bit state from the sampling stage or from the feedback stage are not corrected. However, the first feedback mode does allow for the SSE to operate independently.

The SSE also has a self-correcting mechanism. For example, the SSE may be coupled to two other redundant SSEs so that the three SSEs are grouped as a triple-redundant SSE (TRSSE). When the feedback stage is in a second feedback mode, the output bit state is held in accordance to a majority bit state of a first feedback input bit signal, a second feedback input bit signal, and a third feedback input bit signal. The first feedback input bit signal provides feedback for the output bit signal and thus indicates the output bit state being held by the SSE. The second feedback input bit signal and the third feedback input bit signal may indicate other output bit states of the other output bit signals generated by each of the other redundant SSEs in the TRSSE.

The feedback stage of the SSE holds the output bit state of the output bit signal in accordance with the majority bit state of the first feedback input bit signal, the second feedback input bit signal, and the third feedback input bit signal. Thus, if the first feedback input bit signal has the same feedback input bit state as the second feedback input bit signal and the third feedback input bit signal, then the output bit state is consistent and most likely correct. However, if the first feedback input bit signal has a feedback input bit state different than both the second feedback input bit signal and the third feedback input bit signal, the output bit state is inconsistent and most likely in error. By driving the output bit state in accordance with the majority bit state in the second feedback mode, the output bit state is corrected so that the feedback input bit state of the first feedback input bit signal is the same as the second feedback input bit signal and the third feedback input bit signal. The other redundant SSEs in the TRSSE may employ similar feedback stages to correct the output bit state of their output bit signals.

Also disclosed are embodiments of triple-mode redundant (TMR) state machines (TMRSMs) that can be formed within a plurality of cell rows of a semiconductor substrate, such as CMOS. In one embodiment, a TMRSM has a first pipeline block, a second pipeline block, and a third pipeline block. Each of the pipeline blocks is redundant. Thus, the first pipeline block is formed within a first group of the plurality of cell rows. This first group has a total number, N, of the plurality of cell rows. The second pipeline block is formed within a second group of the plurality of cell rows and also has a total of N of the plurality of cell rows. For each cell row in the second group, the cell row in the second group is redundant to a corresponding cell row in the first group and is separated by at least N of the plurality of cell rows from the corresponding cell row in the first group. Similarly, the third pipeline block is formed within a third group of the plurality of cell rows and the third group has a total of N of the cell rows. For each cell row in the third group, the cell row in the third group is redundant to a corresponding cell row in the second group and is separated by at least N of the plurality of cell rows from the corresponding cell row in the second group. This helps ensure critical node spacing between the first pipeline block, the second pipeline block, and the third pipeline block, since redundant circuitry within each block is separated by at least N of the plurality of cell rows. Accordingly, self-correcting techniques may be implemented while ensuring that critical nodes are not too close together, thereby defeating the purpose of triple-redundancy.

Finally, embodiments of systems and methods for designing a TMRSM are disclosed. In one embodiment, a netlist is obtained. The netlist includes a pipeline circuit layout plan having a plurality of cell layout rows. The pipeline circuit layout plan is split into pipeline block layout stripes having a total of a number, N, of the cell layout rows. Next, placement stripes are inserted into the pipeline circuit layout plan of the netlist. Each placement stripe is at least N empty cell layout rows, and for each pipeline block stripe of the pipeline block layout stripes, two adjacent placement stripes of the placement stripes are designated to the pipeline block stripe. Subsequently, the placement stripes are filled. More specifically, for each of the pipeline block layout stripes, a copy of the pipeline block layout stripe is inserted into one of the two adjacent placement stripes that are designated to the pipeline block layout stripe, and another copy of the pipeline block layout stripe is inserted into another of the two adjacent placement stripes that are designated to the pipeline block layout stripe. In this manner, the pipeline circuit layout is triplicated to design a triple-redundant pipeline circuit layout.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

This disclosure relates generally to systems, devices, and methods related to state machines and sequential state elements (SSEs) for the state machines. State machines are generally formed as integrated circuits (ICs) within a semiconductor substrate. The state machines are synchronized by one or more clock signals to pass and receive bit states. In its simplest form, a state machine may include a single combinational logic element and a single SSE coupled to the combinational logic element. The SSE receives an input bit signal and generates an output bit signal. An output bit state of the output bit signal is based on an input bit state of the input bit signal and the bit states are passed by the SSE in accordance with the clock signal(s). The combinational logic element either receives the output bit signal from the SSE or provides an input bit signal to the SSE. In either case, the passing of bit states to or from the combinational logic element is synchronized by the clock signal(s).

The state machine may be more complex and may be configured as a pipeline circuit having multiple pipeline stages. Each pipeline stage includes a combination circuit and a sequential state circuit and the pipeline stages are coupled sequentially. Thus, the state machine may be any type of pipelined digital circuit or a portion thereof. For example, the state machine may be a microprocessor, or any portion of a microprocessor such as an arithmetic logic unit (ALU), a register file, instruction memory, data memory, and/or the like.

Figure 1:
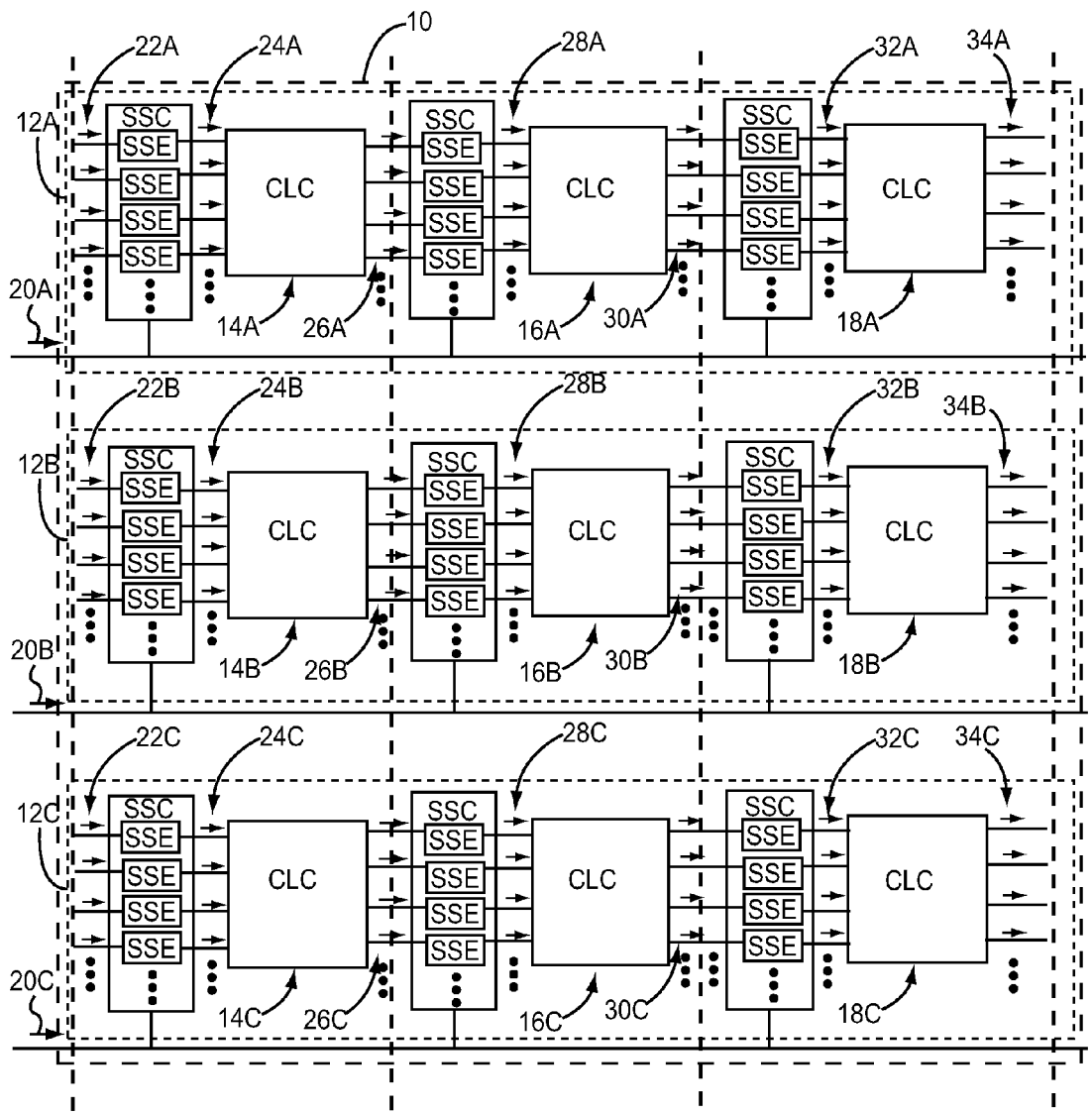
FIG. 1 illustrates a block diagram of one embodiment of a triple-mode redundant state machine (TMRSM) that includes three pipeline circuits with pipeline stages that each include combinational logic circuits (CLCs) and sequential state circuits (SSCs).

FIG. 1 illustrates a block diagram of one embodiment of a triple-mode redundant state machine (TMRSM) 10. In the TMRSM 10, there are three redundant pipeline circuits (referred to generically with reference numeral 12 and individually as elements 12A-12C). Thus, the pipeline circuit 12A, the pipeline circuit 12B, and the pipeline circuit 12C are redundant versions of the same pipeline circuit. In the TMRSM 10, there are three redundant state machines where a first redundant state machine is provided by the pipeline circuit 12A, a second redundant state machine is provided by the pipeline circuit 12B, and a third redundant state machine is provided by the pipeline circuit 12C. Note, however, that although each of the pipeline circuits 12 is redundant, the pipeline circuit 12A, the pipeline circuit 12B, and the pipeline circuit 12C may not be exact replicas of one another. For example, one or more of the pipeline circuits 12 may be logically inverted with respect to the other pipeline circuits 12.

Each of the pipeline circuits 12 is a finite state machine. The operation of the pipeline circuits 12 may be loosely analogized to an assembly line. More specifically, each of the pipeline circuits 12 has pipeline stages (referred to generically for each of the pipeline circuits 12 as elements 14, 16, 18, and specifically for the individual pipeline circuits 12 as elements 14A-14C, 16A-16C, and 18A-18C). In each of the pipeline circuits 12, the different pipeline stages 14, 16, 18 handle a different operation of the finite state machine so that the various operations of the particular finite state machine are handled essentially in a series fashion. Examples of operations that may be provided by the different pipeline stages 14, 16, 18 for the particular finite state machines include instruction fetch operations, instruction decode operations, encode operations, register file operand fetch operations, instruction execution operations, data memory access operations, register file write back operations, and/or the like. Since the TMRSM 10 shown in FIG. 1 has three redundant finite state machines, the pipeline stage 14A in the pipeline circuit 12A, the pipeline stage 14B in the pipeline circuit 12B, and the pipeline stage 14C in the pipeline circuit 12C are configured to provide the same operation. The pipeline stage 16A in the pipeline circuit 12A, the pipeline stage 16B in the pipeline circuit 12B, and the pipeline stage 16C in the pipeline circuit 12C are configured to provide the same operation. The pipeline stage 18A in the pipeline circuit 12A, the pipeline stage 18B in the pipeline circuit 12B, and the pipeline stage 18C in the pipeline circuit 12C are configured to provide the same operation.

As shown in FIG. 1, the different pipeline stages 14, 16, 18 of each of the pipeline circuits 12 include combinational logic circuits (CLCs) and sequential state circuits (SSCs). In each of the pipeline circuits 12, the CLC of the different pipeline stages 14, 16, 18 is specialized to handle the particular operation of the particular pipeline stage 14, 16, 18. Accordingly, for each of the pipeline stages 14, 16, 18 in the pipeline circuits 12, the CLCs include an arrangement of combinational logic elements (i.e., logic gates) configured to provide logic that implements the operation of the pipeline stage 14, 16, 18. Static combinational logic elements and/or dynamic combinational logic elements may be utilized. While each of the pipeline circuits 12 shown in FIG. 1 has three pipeline stages 14, 16, 18, it should be noted that alternative embodiments of the TMRSM 10 may include any number of pipeline stages. This may depend on the particular finite state machine to be provided by each of the pipeline circuits 12 for a particular application.

To synchronize the pipeline stages 14, 16, 18 of each of the pipeline circuits 12, the SSCs coordinate transfer of valid states between the different pipeline stages 14, 16, 18 in accordance with a clock signal (referred to generically with reference numeral 20, and individually as elements 20A-20C). The clock signal 20A received by the pipeline circuit 12A, the clock signal 20B received by the pipeline circuit 12B, and the clock signal 20C received by the pipeline circuit 12C may be the same clock signal 20 or a different clock signal 20. This may depend, for example, on the particular clock distribution technique used for the TMRSM 10. It should be noted that in this particular embodiment, each of the pipeline circuits 12 is assumed to be arranged in a single-phase clock style so that each of the SSCs in the different pipeline stages 14, 16, 18 receives the same clock signal 20. Alternatively, multiple-phase clock styles may be used. When multiple-phase clock styles are implemented, one or more of the SSCs in the different pipeline stages 14, 16, 18 may receive a different clock signal, like the clock signal 20, within each of the pipeline circuits 12. Additionally, when the CLCs are implemented using dynamic combinational logic elements, coordination of precharging may be coordinated by different clock signals, like the clock signal 20, if desired.

For each of the pipeline circuits 12, the SSC in the pipeline stage 14 receives a data input (referred to generically with reference numeral 22 and specifically with reference numerals 22A-22C). Based on the data input 22 and in accordance with the clock signal 20, the SSC in the pipeline stage 14 of each of the pipeline circuits 12 generates a data output (referred to generically with reference numeral 24 and specifically with reference numerals 24A-24C). In this embodiment, the data input 22 for each the pipeline stages 14 includes a plurality of input bit signals that provide the various bits of the data input 22. Accordingly, the data output 24 from the SSC of each of the pipeline stages 14 includes a plurality of output bit signals that provide the various bits of the data output 24. Multiple SSEs are thus included in the SSC of each of the pipeline stages 14, 16, 18.

More specifically, the SSC in the pipeline stage 14A provides an SSE to receive each input bit signal in the data input 22A and to generate each output bit signal in the data output 24A. The SSC in the pipeline stage 14B has an SSE to receive each input bit signal in the data input 22B and generate each output bit signal in the data output 24B. The SSC in the pipeline stage 14C has an SSE to receive each input bit signal in the data input 22C and generate each output bit signal in the data output 24C. The CLCs of each of the pipeline stages 14 perform the designated pipeline operation in accordance with their logical arrangement to generate a data input (referred to generically with reference numeral 26 and specifically with reference numerals 26A-26C) for each of the next pipeline stages 16.

It should be noted that the data inputs 22 may have any number of input bit signals depending on a data type. The data inputs 26 may also have any number of input bit signals according to a data type. However, the data inputs 22 and the data inputs 26 may have different numbers of input bit signals since the data types of the data inputs 22 and the data inputs 26 may be different. To illustrate one non-limiting example, if the pipeline stages 14 each provide a decoding operation, the number of input bit signals in the data inputs 22 would be greater than the number of input bit signals in the data inputs 26. In another non-limiting example, if the pipeline stages 14 each provide an encoding operation, the number of input bit signals in the data inputs 22 would be less than the number of input bit signals in the data inputs 26.

For each of the pipeline circuits 12, the SSC in the pipeline stage 16 receives the data input 26 from the previous pipeline stage 14. Based on the data input 26 and in accordance with the clock signal 20, the SSC in the pipeline stage 16 of each of the pipeline circuits 12 generates a data output (referred to generically with reference numeral 28 and specifically with reference numerals 28A-28C). As mentioned above, the data input 26 for each the pipeline stages 16 includes a plurality of input bit signals that provide the various bits of the data input 26. Accordingly, the data output 28 from the SSC of each of the pipeline stages 16 includes a plurality of output bit signals that provide the various bits of the data output 28. Multiple SSEs are thus included in the SSC of each of the pipeline stages 16.

More specifically, the SSC in the pipeline stage 16A provides an SSE to receive each input bit signal in the data input 26A and to generate each output bit signal in the data output 28A. The SSC in the pipeline stage 16B has an SSE to receive each input bit signal in the data input 26B and generate each output bit signal in the data output 28B. The SSC in the pipeline stage 16C has an SSE to receive each input bit signal in the data input 26C and generate each output bit signal in the data output 28C. The CLCs of each of the pipeline stages 16 perform the designated pipeline operation in accordance with their logical arrangement to generate a data input (referred to generically with reference numeral 30 and specifically with reference numerals 30A-30C) for each of the next pipeline stages 18. The data inputs 26 and the data inputs 30 may or may not have different numbers of input bit signals depending on their data types.

For each of the pipeline circuits 12, the SSC in the pipeline stage 18 receives the data input 30 from the previous pipeline stage 16. Based on the data input 30 and in accordance with the clock signal 20, the SSC in the pipeline stage 18 of each of the pipeline circuits 12 generates a data output (referred to generically with reference numeral 32 and specifically with reference numerals 32A-32C). In FIG. 1, the data input 30 for each the pipeline stages 18 includes a plurality of input bit signals that provide the various bits of the data input 30. Accordingly, the data output 32 from the SSC of each of the pipeline stages 16 includes a plurality of output bit signals that provide the various bits of the data output 32. Multiple SSEs are thus included in the SSC of each of the pipeline stages 18.

More specifically, the SSC in the pipeline stage 18A provides an SSE to receive each input bit signal in the data input 30A and to generate each output bit signal in the data output 32A. The SSC in the pipeline stage 18B has an SSE to receive each input bit signal in the data input 30B and generate each output bit signal in the data output 32B. The SSC in the pipeline stage 18C has an SSE to receive each input bit signal in the data input 30C and generate each output bit signal in the data output 32C. The CLCs of each of the pipeline stages 18 perform the designated pipeline operation in accordance with their logical arrangement to generate a data input (referred to generically with reference numeral 34 and specifically with reference numerals 34A-34C). The data inputs 30 and the data inputs 34 may or may not have different numbers of input bit signal depending on their data types.

As mentioned above, different embodiments of the TMRSM 10 may have any number of pipeline stages. For instance, the data inputs 34 may be transmitted externally to one or more external devices or may be provided to pipeline stages downstream from the pipeline stages 18. Similarly, the data inputs 22 for the pipeline stages 14 may be received from external devices or may be received from upstream pipeline stages. In fact, as explained below, any design for a finite state machine may be triplicated to provide a design for an embodiment of the TMRSM 10.

Figure 2:
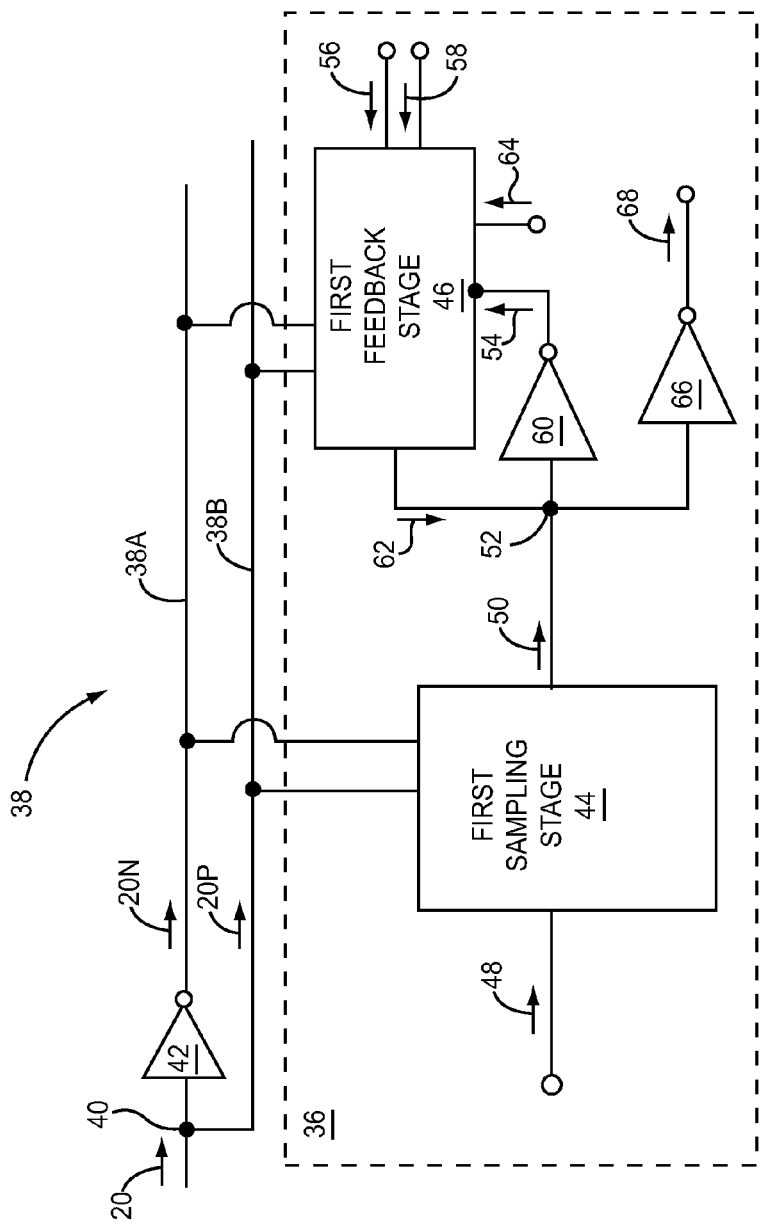
FIG. 2 illustrates a block diagram of an exemplary latch, which is an exemplary sequential state element (SSE) that may be utilized within the SSCs shown in FIG. 1.

Referring now to FIG. 2, FIG. 2 illustrates a block diagram of an exemplary SSE. The general purpose of SSEs is to hold bit states for processing by the CLCs while preventing subsequent bit states from entering the CLCs too soon. In FIG. 2, the SSE illustrates one embodiment of a latch 36. Embodiments of the latch 36 may be provided as one or more of the SSEs within the SSCs shown in FIG. 1. Other types of SSEs that may be provided within the SSCs include flip-flops and bistables.

The latch 36 shown in FIG. 2 is synchronizable in accordance with the clock signal 20, which oscillates between a first clock state and a second clock state. The amount of time it takes the clock signal to oscillate once between the first clock state and the second clock state is generally referred to as a clock cycle. The latch 36 is configured to receive the clock signal 20, which coordinates the operation of the latch 36. In this example, a clock signal path 38 is split at node 40 into two clock paths 38A and 38B. An inverter 42 is provided in the clock path 38A. The inverter 42 is operable to invert the clock signal 20 within the clock path 38A. No inverter has been provided in the clock path 38B. Accordingly, the clock signal 20 is received by the latch 36 as a differential clock signal having a negative side clock signal 20N transmitted on the clock path 38A, while a positive side clock signal 20P is provided in the clock path 38B.

The latch 36 has a first sampling stage 44 and a first feedback stage 46. Both the first sampling stage 44 and the first feedback stage 46 receive the clock signal 20 (as the negative side clock signal 20N and the positive side clock signal 20P) from the clock signal path 38. The first sampling stage 44 receives a first input bit signal 48 having a first input bit state. For example, the first input bit state could be in a higher voltage state to represent a logical "1." On the other hand, the first input bit state could be in a lower voltage state to represent a logical "0." While the clock signal 20 is in the first clock state, the first sampling stage 44 is configured to sample the first input bit signal 48 and generate a first output bit signal 50 having a first output bit state provided in accordance with the first input bit state. In other words, the latch 36 is transparent while the clock signal 20 is in the first clock state. Depending on the embodiment of the first sampling stage 44, the first sampling stage 44 may be configured to generate the first output bit signal 50 so that the first output bit state is the same as the first input bit state or inverted with respect to the first input bit state. In this example, the first output bit state is inverted with respect to the first input bit state. While the clock signal 20 is in the first clock state, the first output bit signal is received at a storage node 52 with the first output bit state as provided by the first sampling stage 44 while the clock signal 20 is in the first clock state.

Once the clock signal 20 switches to the second clock state, the first feedback stage 46 is activated and the latch 36 is closed. In other words, the first sampling stage 44 becomes opaque and changes to the first input bit state do not affect the first output bit state of the first output bit signal 50. The first feedback stage 46 is configured to drive the first output bit state of the first output bit signal 50 while the clock signal is in the second clock state. However, the first feedback stage 46 is operable in a first feedback mode and a second feedback mode.

When the first feedback stage 46 is in the first feedback mode, the first output bit state of the first output bit signal 50 is held as provided from the first sampling stage 44. For example, if the first output bit state is provided from the first sampling stage 44 to represent a logical "1," the first feedback stage 46 drives the first output bit signal 50 at the storage node 52 to maintain the first output bit signal 50 as representing a logical "1." On the other hand, if the first output bit state is provided from the first sampling stage 44 to represent a logical "0," the first feedback stage 46 drives the first output bit signal 50 at the storage node 52 to maintain the first output bit signal 50 as representing a logical "0."

In contrast, when the first feedback stage 46 is in the second feedback mode, the first output bit state is held in accordance with a majority bit state of a first feedback input bit signal 54, a second feedback input bit signal 56, and a third feedback input bit signal 58. The first feedback input bit signal 54 provides feedback for the first output bit signal 50 at the storage node 52. Accordingly, the first feedback input bit signal 54 has a first feedback bit state in accordance with the first output bit state of the first output bit signal 50 at the storage node 52. In this example, an inverter 60 is configured to receive the first output bit signal 50 from the first sampling stage 44. More specifically, the inverter 60 is coupled to the storage node 52 to receive the first output bit signal 50. The inverter 60 generates the first feedback input bit signal 54, which has a first feedback bit state that is inverted with respect to the first output bit state of the first output bit signal 50.

When the first feedback stage 46 is in the second feedback mode, the second feedback input bit signal 56 may be received from a second latch and the third feedback input bit signal 58 may be received from a third latch. For example, if the latch 36 is part of or one of the SSEs in the SSC of the pipeline stage 16A shown in FIG. 1, the second feedback input bit signal 56 is received from a redundant SSE in the SSC of the pipeline stage 16B. The second feedback input bit signal 56 has a second feedback bit state set by the redundant SSE. Analogously, the third feedback input bit signal 58 is received from a redundant SSE in the SSC of the pipeline stage 16C. The third feedback input bit signal 58 has a third feedback bit state set by the redundant SSE. If the majority (two or more) of the feedback bit states (i.e., the first feedback bit state, the second feedback bit state, and the third feedback bit state) are a logical "1," the majority bit state is logical "1." In contrast, if the majority of the feedback bit states are a logical "0," the majority bit state is a logical "0." If the first output bit signal 50 at the storage node 52 provides the first feedback bit state as the majority bit state, the first feedback stage 46 maintains the first output bit state of the first output bit signal 50. However, if the first output bit signal 50 at the storage node 52 provides the first feedback bit state opposite to the majority bit state, the first feedback stage 46 drives the first output bit state to the opposite bit state.

In this embodiment, the inverter 60 generates the first feedback input bit signal 54 having a feedback bit state that is inverted with respect to the first output bit state of the first output bit signal 50. Accordingly, when the first output bit state of the first output bit signal 50 is a logical "1," the first feedback bit state of the first feedback bit signal 54 is a logical "0." In contrast, when the first output bit state of the first output bit signal 50 is a logical "0," the first feedback bit state of the first feedback bit signal 54 is a logical "1." Thus, this embodiment of the first feedback stage 46 is configured to drive the first output bit state of the first output bit signal 50 as an inverse of the majority bit state of the first feedback input bit signal 54, the second feedback input bit signal 56, and the third feedback input bit signal 58. For instance, if the majority bit state of the feedback bit states is a logical "1" and the first output bit state is a logical "0," the first output bit state is maintained at the storage node 52 at logical "0." Similarly, if the majority bit state of the feedback bit states is a logical "0" and the first output bit state is a logical "1," the first output bit state is maintained at the storage node 52 at logical "1." However, if the majority bit state of the feedback bit states is a logical "1" and the first output bit state is a logical "1," the first output bit state is driven at the storage node 52 to the opposite, logical "0." Similarly, if the majority bit state of the feedback bit states is a logical "0" and the first output bit state is a logical "0," the first output bit state is driven at the storage node 52 to the opposite, logical "1."

The first feedback stage 46 is thus voter corrected in the second feedback mode since the first output bit state of the first output bit signal 50 is held in accordance with the majority bit state of a first feedback input bit signal 54, the second feedback input bit signal 56, and the third feedback input bit signal 58 when the first feedback stage 46 is in the second feedback mode. To provide an exemplary explanation of the voter correction in the second feedback mode, the latch 36 is again assumed to be part of one of the SSEs in the SSC of the pipeline stage 16A shown in FIG. 1, as explained above. In the second feedback mode each of the pipeline circuits 12 (shown in FIG. 1) can be assumed to be replicating the same behavior. Thus, if the first feedback bit state of the first feedback input bit signal 54 is driven to a feedback bit state that is opposite to both the second feedback bit state of the second feedback input bit signal 56 and the third feedback bit state of the third feedback input bit signal 58, it can be presumed that an error has occurred in the pipeline circuit 12A. For instance, perhaps a radiation strike at the CLC of the pipeline stage 14A caused the CLC to provide incorrect bit states. As a result, an inappropriate bit state is provided to the latch 36.

In this case, the first sampling stage 44 provides the first output bit signal 50 with the incorrect bit state and thus the first feedback bit state of the first feedback input bit signal 54 is opposite to the second feedback bit state of the second feedback input bit signal 56 and the third feedback bit state of the third feedback input bit signal 58. However, in the second feedback mode, the first feedback stage 46 holds the first output bit state in accordance with the majority bit state. When the clock signal 20 was in the first clock state, the first sampling stage 44 provided the first output bit state of the first output bit signal 50 such that the first feedback bit state is in a minority bit state. Accordingly, when the clock signal 20 oscillates into the second clock state, the first feedback stage 46 drives the first output bit state to the opposite bit state, thereby driving the first feedback bits state of the feedback input bit signal 54.

As shown in FIG. 2, the first feedback stage 46 is configured to generate a feedback output bit signal 62 to drive the first output bit state of the first output bit signal 50 while the clock signal 20 is in the second clock state. As explained above, the first feedback stage 46 is operable in the first feedback mode to set the feedback bit state of the first feedback bit signal 54 in accordance with the first output bit state of the first output bit signal 50. Consequently, in the first feedback mode, the first feedback stage 46 simply reinforces the first output bit state of the first output bit signal 50 at the storage node 52. The latch 36 thus operates independently of the other redundant second and third latches in the first feedback mode. On the other hand, in the second feedback mode, the first feedback stage 46 is synchronized with the other latches to provide voter correction. To drive the first output bit state of the first output bit signal 50, the first feedback stage 46 is operable in the second feedback mode to set a feedback output bit state of the feedback output bit signal 62 in accordance with the majority bit state of the first feedback input bit signal 54, the second feedback input bit signal 56, and the third feedback input bit signal 58.

As shown in FIG. 2, the first feedback stage 46 is further configured to receive a feedback mode signal 64. The feedback mode signal 64 is provided at a first signal level to indicate the first feedback mode and at a second signal level to indicate the second feedback mode. Thus, the first feedback stage 46 switches to and from the first feedback mode and the second feedback mode in response to the signal level of the feedback mode signal 64. For example, the first feedback stage 46 operates in the first feedback mode when the feedback mode signal 64 is provided at the first signal level. In contrast, the first feedback stage 46 operates in the second feedback mode when the feedback mode signal 64 is provided at the second signal level.

An inverter 66 is configured to receive the first output bit signal 50 at the storage node 52 and generate a final output bit signal 68. This final output bit signal 68 may be transmitted to a CLC of one of the pipeline stages 14 (shown in FIG. 1). Due to the inversion by the inverter 66, the final output bit state is inverted with respect to the first output bit signal 50. When the first sampling stage 44 is opaque, the final output bit state is isolated from changes in the first input bit state of the first input bit signal 48. In essence, these changes cannot enter the storage node 52 and affect the final output bit state. However, once the clock signal 20 oscillates back into the first clock state, the first sampling stage 44 again becomes transparent. Thus, the first input bit state of the first input bit signal 48 can change the first output bit state of the first output bit signal 50 at the storage node 52. In this manner, valid bit states are passed according to the timing of the clock signal 20.

Figure 3:
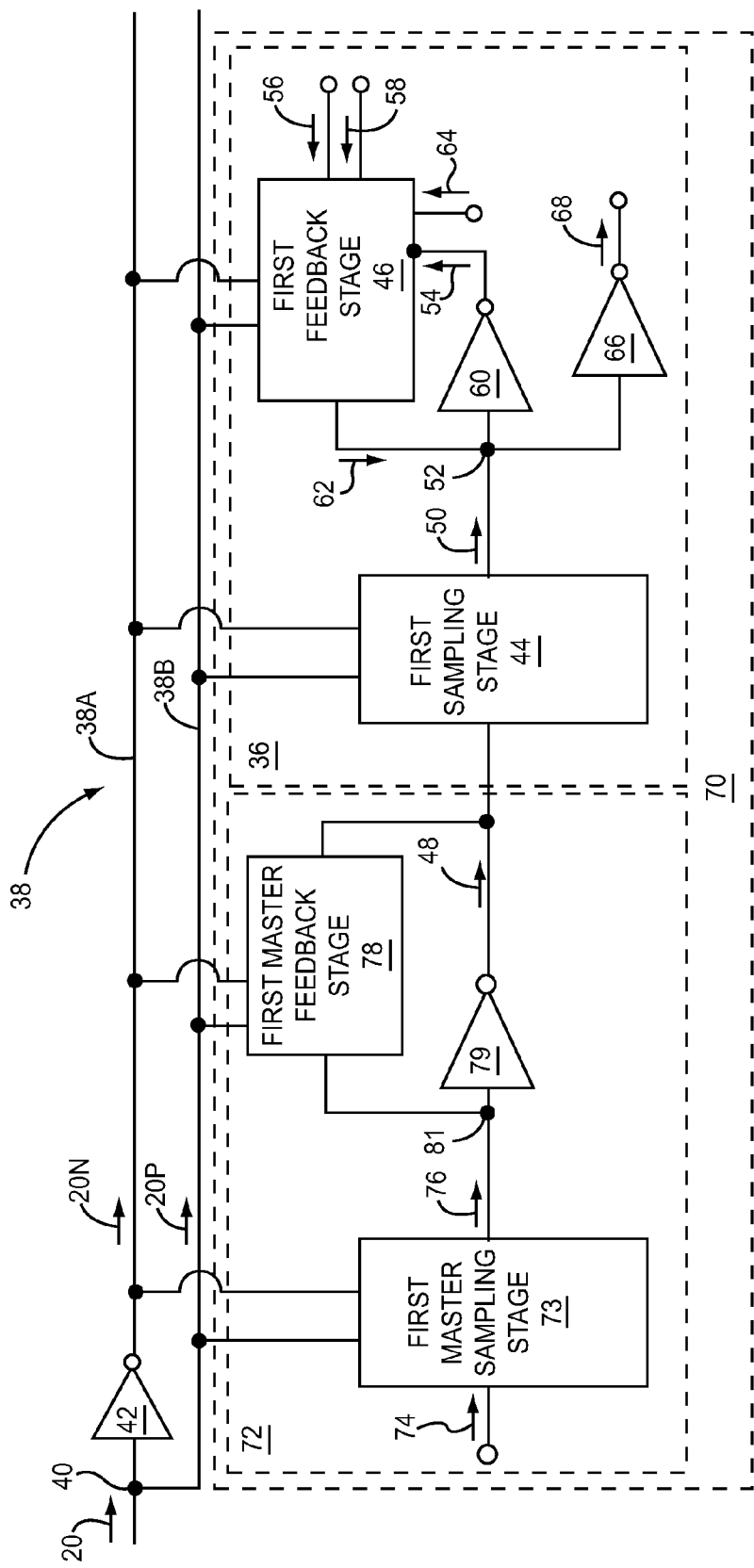
FIG. 3 illustrates a block diagram of an exemplary flip-flop, which is an exemplary SSE that may be utilized within the SSCs shown in FIG. 1.

FIG. 3 illustrates a block diagram of another exemplary SSE. In this example, the SSE shown in FIG. 3 illustrates one embodiment of a flip-flop 70. The flip-flop 70 has the same latch 36 described above with regard to FIG. 2. However, the flip-flop 70 also includes a master latch 72. The master latch 72 is coupled to the latch 36 so that the latch 36 is a slave latch. The master latch 72 has a first master sampling stage 73 configured to sample an initial input bit signal 74 having an initial input bit state to generate the first input bit signal 48 while the clock signal 20 is in the second clock state. Thus, the master latch 72 is transparent while the latch 36 is opaque. To generate the first input bit signal 48, the first master sampling stage 73 generates an intermediary output bit signal 76. Since an intermediary output bit state of the intermediary output bit signal 76 is based on the initial input bit state, the first input bit state of the first input bit signal 48 is related to the intermediary output bit state of the intermediary output bit signal 76. In this example, the intermediary output bit state and the first input bit state are inverted by an inverter 79.

A first master feedback stage 78 is configured to drive the intermediary output bit state of the intermediary output bit signal 76 such that the intermediary output bit state is held at storage node 81 as provided from the first master sampling stage 73 while the clock signal 20 is in the first clock state. Thus, the master latch 72 is opaque while the (slave) latch 36 is transparent. The master latch 72 thus deraces the path to the latch 36 so that hold time requirements for the latch 36 are more easily met. The flip-flop 70 thus holds two bit values during the opposite clock states of a clock cycle: the intermediary output bit state at the storage node 81 and the first output bit state at the storage node 52.

Figure 4:
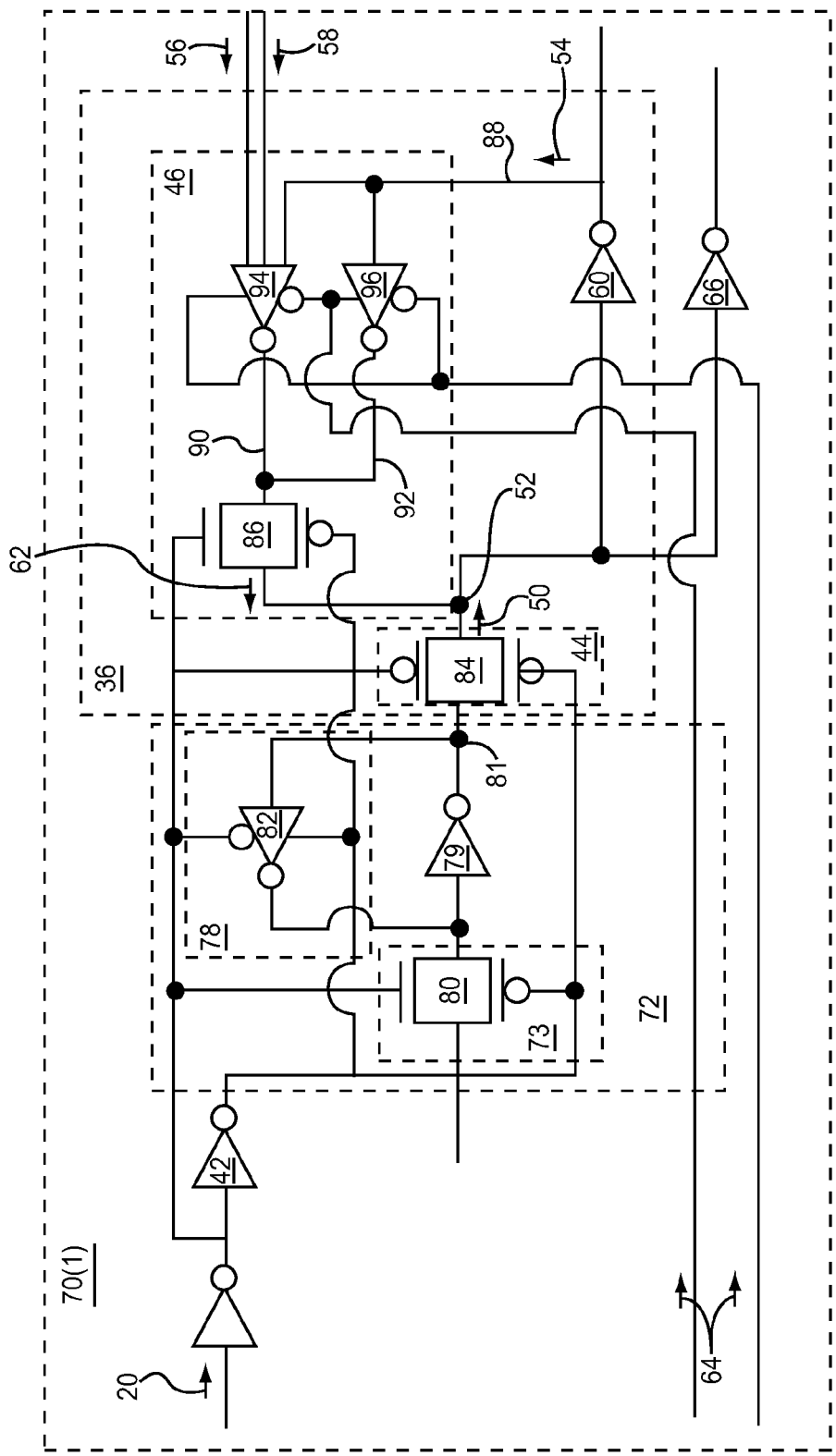
FIG. 4 illustrates a circuit diagram of a flip-flop, which is one embodiment of the flip-flop shown in FIG. 3.

FIG. 4 illustrates a circuit diagram of a flip-flop 70(1). The flip-flop 70(1) is one embodiment of the exemplary flip-flop 70 shown in FIG. 3. The flip-flop 70(1) shown in FIG. 4 also includes a circuit diagram of one embodiment of the latch 36 shown in FIG. 2. In the master latch 72, the first master sampling stage 73 is provided by a CMOS transmission gate 80 that is activated when the clock signal 20 is high. The first master feedback stage 78 has a tristate inverter gate 82 that is activated when the clock signal 20 is low. In the latch 36, a CMOS transmission gate 84 provides the first sampling stage 44, which is activated when the clock signal 20 is low.

The first feedback stage 46 has a CMOS transmission gate 86, which activates the first feedback stage 46 when the clock signal 20 is high. As shown in FIG. 4, a feedback path 88 is split off into two branches 90, 92. The first feedback stage 46 includes a majority gate 94 in the first branch 90, which in this example is an inverter majority gate. The second branch 92 includes a tristate gate 96, which in this example is a tristate inverter gate. As shown in FIG. 4, the feedback mode signal 64 is received in this embodiment by the first feedback stage 46 as a differential signal. The feedback mode signal 64 is provided at a first signal level to indicate the first feedback mode and at a second signal level to indicate the second feedback mode.

The first feedback stage 46 is configured to operate in the first feedback mode when the feedback mode signal 64 is provided at the first signal level. To operate in the first feedback mode, the tristate gate 96 shown in FIG. 4 is configured to activate in response to the feedback mode signal 64 being provided at the first signal level. In contrast, the majority gate 94 is configured to deactivate in response to the feedback mode signal 64 being provided at the first signal level. While the clock signal 20 is low and the latch 36 is transparent, the first output bit state of the first output bit signal 50 is set up by the first sampling stage 44 at the storage node 52 with a particular bit state (either a logical "1" or "0"). Once the clock signal 20 is high and the latch 36 becomes opaque, the tristate gate 96 receives the first feedback input bit signal 54 with the first feedback bit state provided in accordance with the first output bit state. Due to the inverter 60, the first feedback bit state is the inverse of the first output bit state. The tristate gate 96 sets the feedback output bit state of the feedback output bit signal 62 only in accordance with the first feedback input bit state of the first feedback input bit signal 54. In this example, the tristate gate 96 is a tristate inverter gate and thus the feedback output bit state is set to an inverse of the first feedback input bit state. Consequently, in the first feedback mode, the first feedback stage 46 simply holds the first output bit state at the storage node 52 as it was provided from the first sampling stage 44 while the clock signal 20 is low.

The first feedback stage 46 is also configured to operate in the first feedback mode when the feedback mode signal 64 is provided at the second signal level. To operate in the second feedback mode, the majority gate 94 shown in FIG. 4 is configured to activate in response to the feedback mode signal 64 being provided at the second signal level. In contrast, the tristate gate 96 is configured to deactivate in response to the feedback mode signal 64 being provided at the second signal level. Once the clock signal 20 is high and the latch 36 becomes opaque, the majority gate 94 receives the first feedback input bit signal 54 with the first feedback bit state, the second feedback input bit signal 56 with the second feedback bit state, and the third feedback input bit signal 58 with the third feedback bit state. The majority gate 94 sets the feedback output bit state in accordance with the majority bit state of the first feedback input bit signal 54, the second feedback input bit signal 56, and the third feedback input bit signal 58.

In this example, the majority gate 94 is an inverse majority gate and thus the feedback output bit state is set to an inverse of the majority bit state. Consequently, in the second feedback mode, the first feedback stage 46 holds the first output bit state at the storage node 52 as the inverse of the majority bit state while the clock signal 20 is low.

Figure 5:
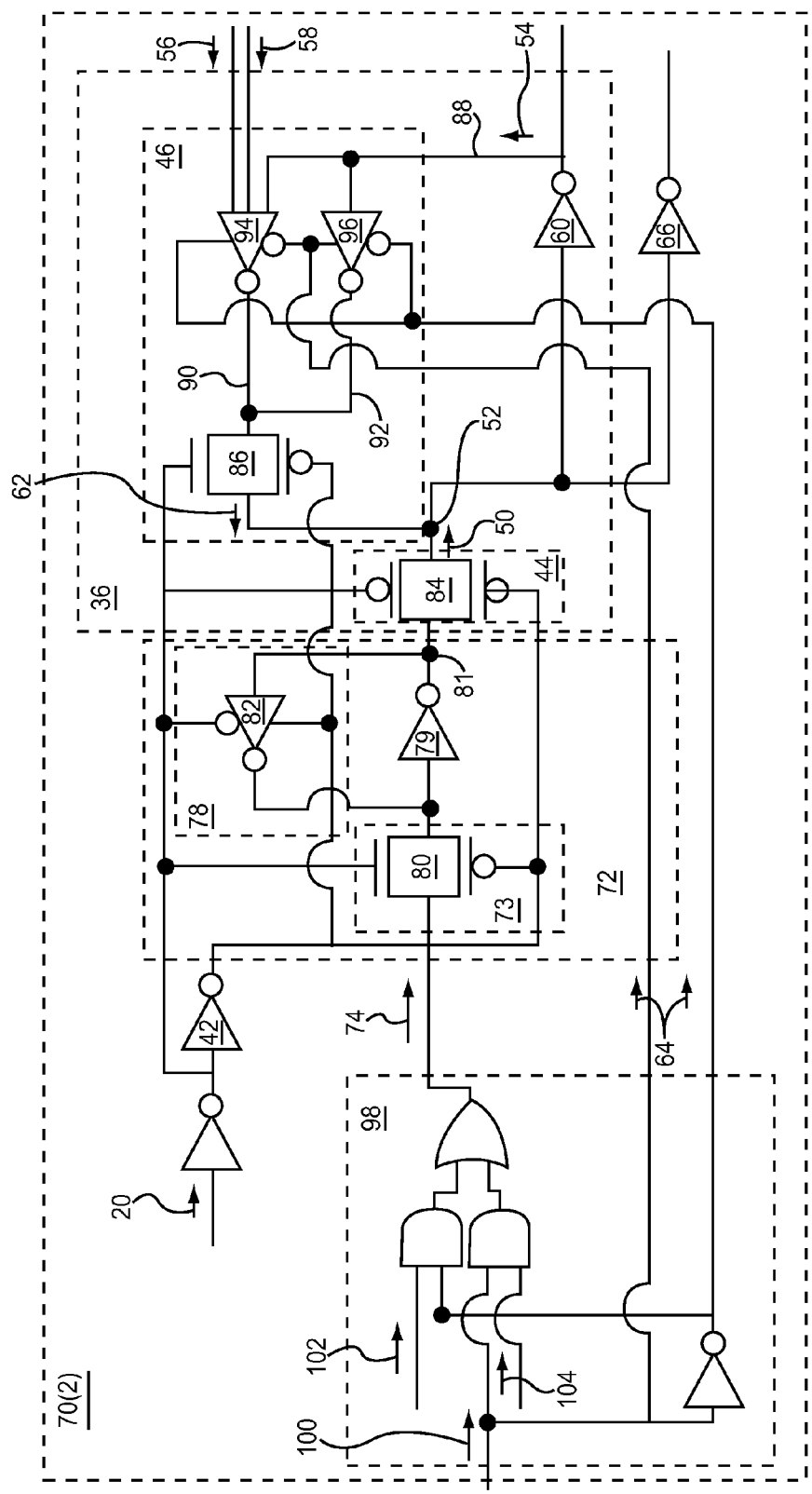
FIG. 5 illustrates a circuit diagram of another flip-flop, which is another embodiment of the flip-flop shown in FIG. 3.

FIG. 5 illustrates a circuit diagram of another embodiment of a flip-flop 70(2), which may be provided as one of the SSEs shown in FIG. 1. The flip-flop 70(2) is another embodiment of the flip-flop 70 shown in FIG. 3. The flip-flop 70(2) is the same as the flip-flop 70(1) shown in FIG. 4, except that the flip-flop 70(2) includes a first multiplexer 98, which is configured to provide the initial input bit signal 74. In order to generate the initial input bit signal 74, the first multiplexer 98 is configured to receive a multiplexer select signal 100, a first data input bit signal 102, and a second data input bit signal 104. Either the first data input bit signal 102 or the second data input bit signal 104 is provided by the first multiplexer 98 as the initial input bit signal 74. More specifically, the first multiplexer 98 is configured to select between the first data input bit signal 102 and the second data input bit signal 104 as the initial input bit signal in response to the multiplexer select signal 100. For example, if the multiplexer select signal 100 is provided in a multiplexer select signal state, the first data input bit signal 102 is selected as the initial input bit signal 74. On the other hand, if the multiplexer select signal 100 is provided in an opposite multiplexer select signal state, the second data input bit signal 104 is provided as the initial input bit signal 74.

Note that in this embodiment, the first feedback stage 46 in the latch 36 is configured to receive the multiplexer select signal 100 as the feedback mode signal 64. In this embodiment, the first data input bit signal 102 is a data line bit signal. For example, if the flip-flop 70(2) is one of the SSEs in the SSC of the pipeline stage 16A shown in FIG. 1, the first data input bit signal 102 may be one of the input bit signals of the data input 26A from the CLC of the pipeline stage 14A. The second data input bit signal 104 in this embodiment is a scan mode bit signal. The multiplexer select signal 100 is a scan enable signal. When scan enable signal is in a scan enable state, the majority gate 94 is deactivated and the tristate gate 96 is activated so that the first feedback stage 46 operates in the first feedback mode. The second data input bit signal 104 (the scan mode bit signal) in this embodiment is provided by the first multiplexer 98 as the initial input bit signal 74. On the other hand, when the scan enable signal is in a scan disenable state, the tristate gate 96 is deactivated and the majority gate 94 is activated so that the first feedback stage 46 operates in the second feedback mode. Accordingly, this configuration allows scan mode decoupling of pipeline stages when the scan enable signal is in the scan enable state. In this manner, the pipeline stages can be tested for defects.

Figure 6:
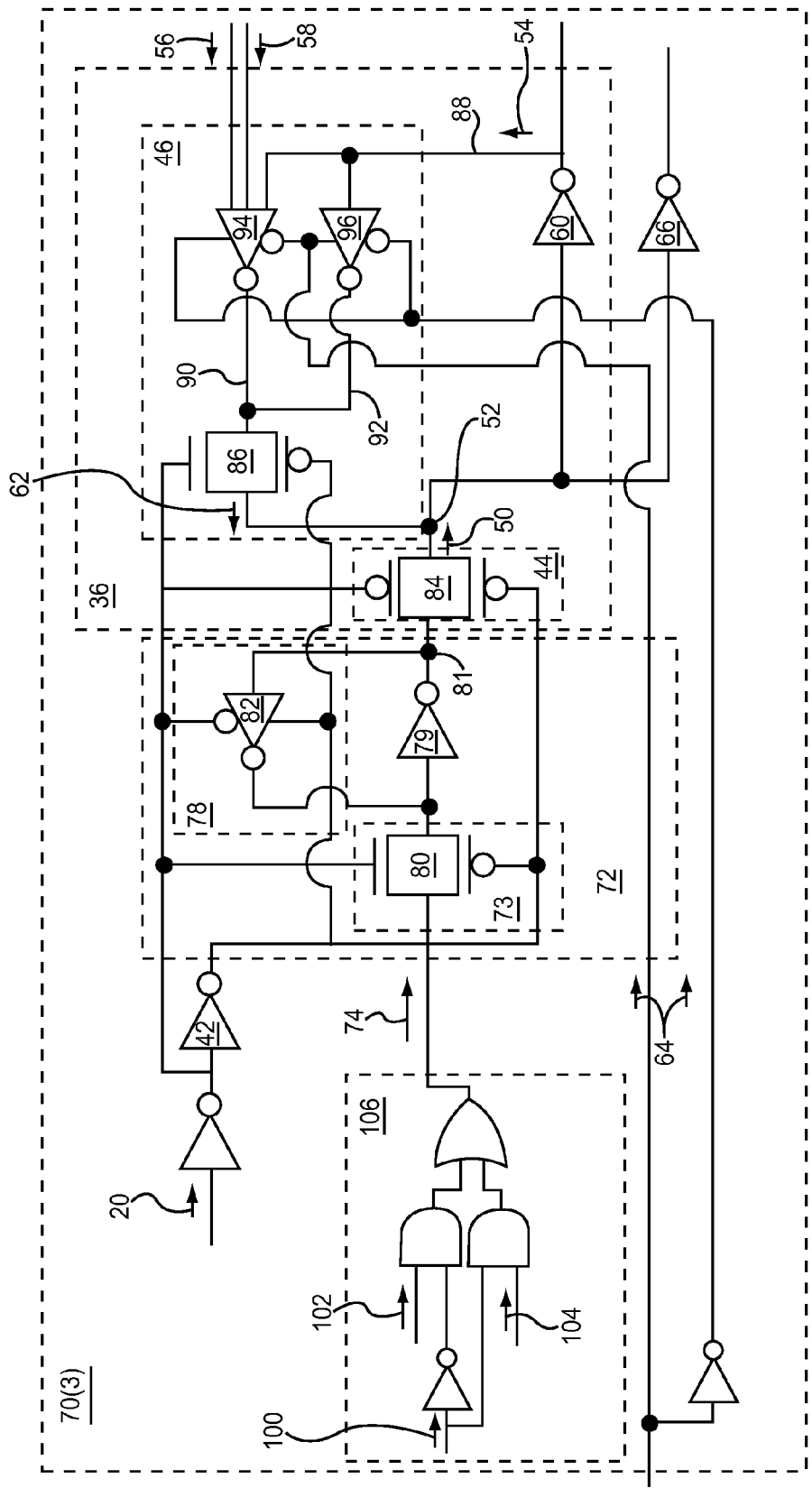
FIG. 6 illustrates a circuit diagram of yet another flip-flop, which is yet another embodiment of the flip-flop shown in FIG. 3.

FIG. 6 illustrates a circuit diagram of another embodiment of a flip-flop 70(3), which may be provided as one of the SSEs shown in FIG. 1. The flip-flop 70(3) is still another embodiment of the exemplary flip-flop 70 shown in FIG. 3. In FIG. 6, the flip-flop 70(3) is the same as the flip-flop 70(2) shown in FIG. 5, except that the flip-flop 70(3) has a different embodiment of a first multiplexer 106. Unlike the first multiplexer 98 shown in FIG. 5, the first multiplexer 106 of FIG. 6 is configured to receive the multiplexer select signal 100 and the feedback mode signal 64 as separate signals.

Accordingly, in this embodiment, the majority gate 94 can be deactivated and the tristate gate 96 can be activated while the first multiplexer 106 still provides the initial input bit signal 74 as the first data input bit signal 102. Additionally, the majority gate 94 can be deactivated and the tristate gate 96 can be activated while the first multiplexer 106 provides the initial input bit signal 74 as the second data input bit signal 104. Thus, this configuration of the flip-flop 70(3) may be utilized to allow the pipeline circuits 12 (shown in FIG. 1) to operate with each other as redundant state machines, to allow each of the pipeline circuits 12 to operate as independent state machines, and to allow for scan testing. For example, when the first feedback stage 46 operates in the second feedback mode, the majority gate 94 is activated and the tristate gate 96 is deactivated. The flip-flop 70(3) would operate in this manner when the pipeline circuits 12 (shown in FIG. 1) are operating as redundant state machines.

On the other hand, if the first feedback stage 46 operates in the first feedback mode, the majority gate 94 is deactivated and the tristate gate 96 is activated. Still, the first multiplexer 106 can provide the initial input bit signal 74 as the first data input bit signal 102 because the multiplexer select signal 100 is independent of the feedback mode signal 64 and scan testing can still be disabled. The flip-flop 70(3) would operate in this manner when the pipeline circuits 12 are operating as independent state machines. However, the first multiplexer 106 can also provide the initial input bit signal 74 as the second data input bit signal 104 when the first feedback stage 46 is in the second feedback mode. The flip-flop 70(3) would operate in this manner to provide for scan mode decoupling.

Figure 7:
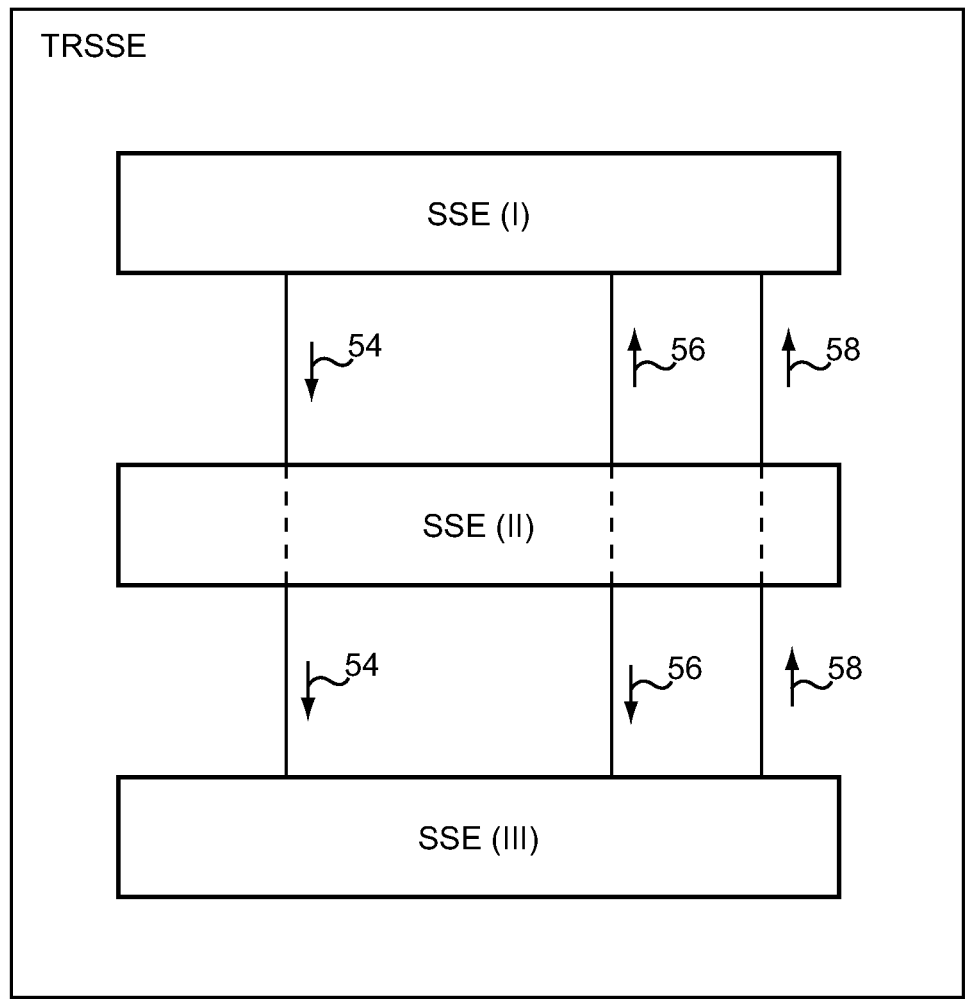
FIG. 7 illustrates a block diagram of an exemplary triple-redundant sequential state element (TRSSE).

FIG. 7 illustrates a block diagram of a triple redundant sequential state element (TRSSE). The TRSSE has an SSE(I), an SSE(II), and an SSE(III), which are redundant and are each voter configured. Accordingly, each SSE may be arranged as any of the SSEs. Each SSE may also have any one of the arrangements described above with regard to FIGS. 2-6. However, each SSE would generate a different one of the feedback input bit signals 54, 56, 58 and provide it to the other SSEs. In this embodiment, the SSE(I) generates the first feedback input bit signal 54 and provides it to the SSE(II) and the SSE(III). The SSE(II) generates the second feedback input bit signal 56 and provides it to the SSE(I) and the SSE(III). The SSE(III) generates the third feedback input bit 58 and provides it to the SSE(I) and the SSE(II).

Figure 8A:
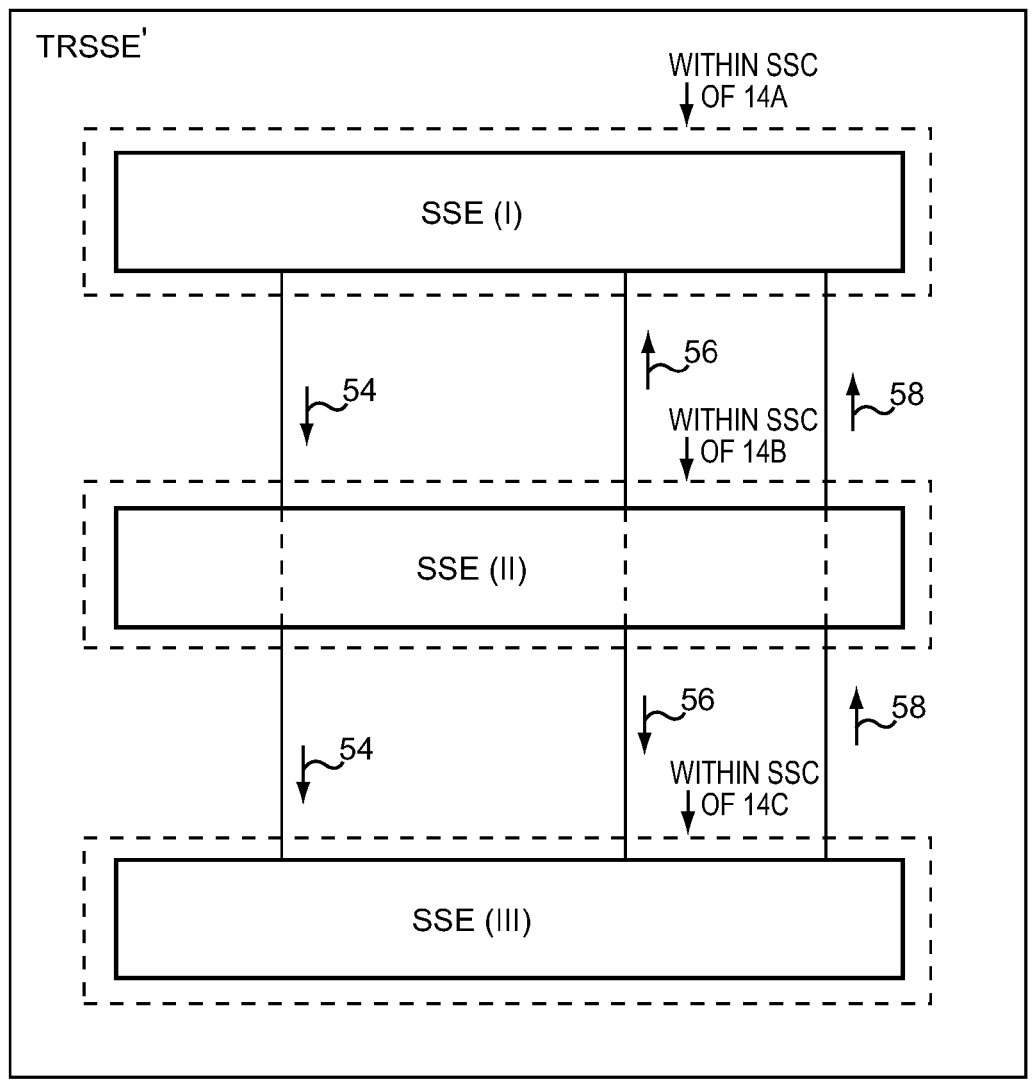
FIGS. 8A-8C illustrate how different embodiments of the TRSSE may be provided in the TMRSSM shown in FIG. 1.
Figure 8B:
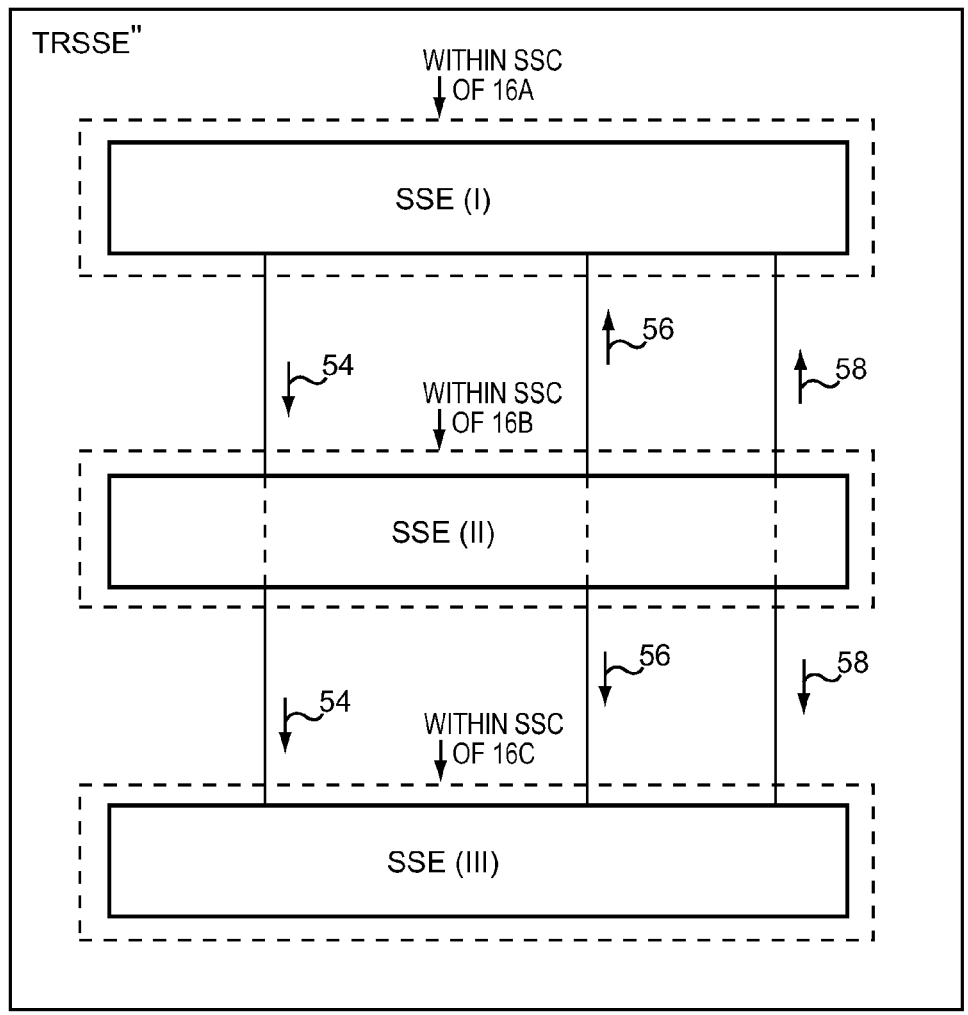
Figure 8C:
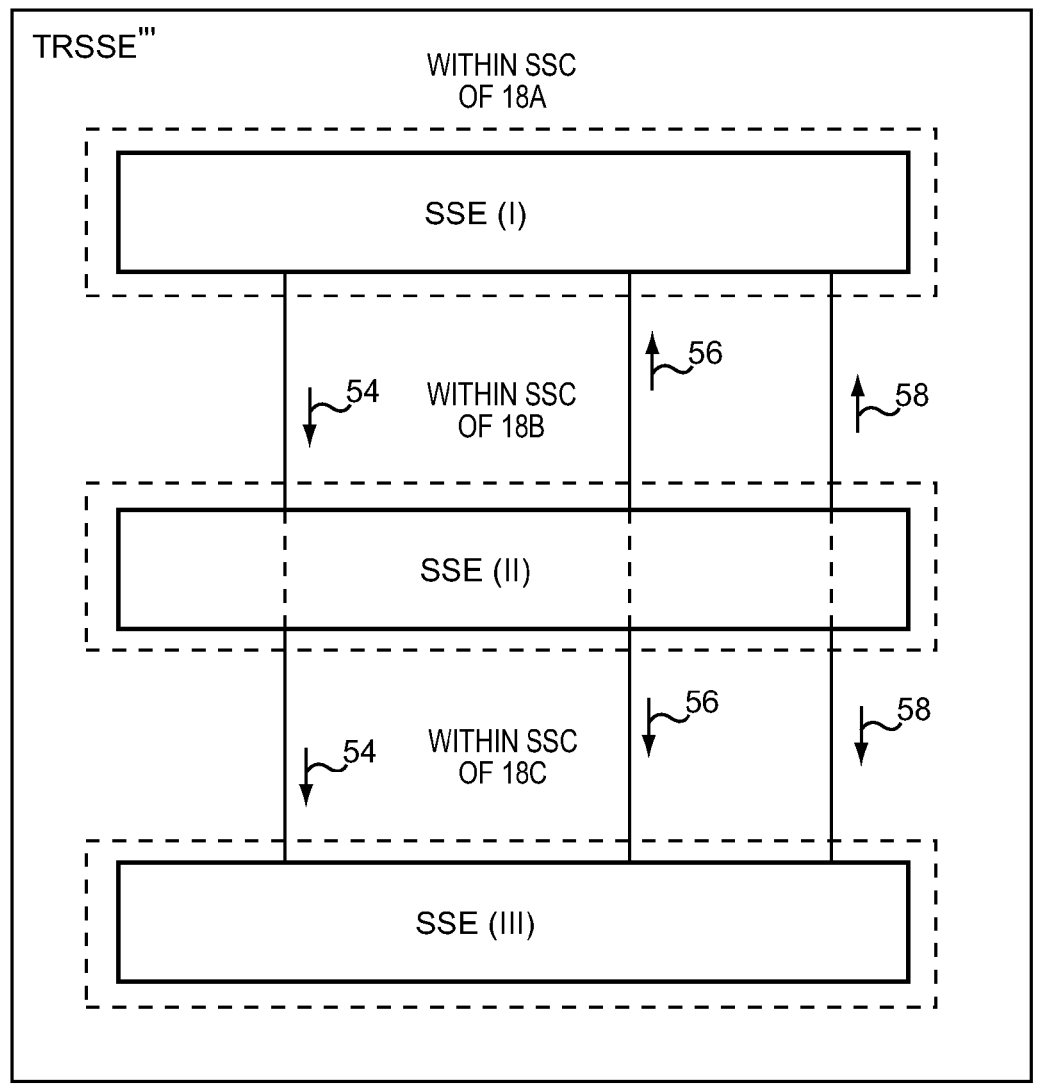

To illustrate how the TRSSE would be provided in the TMRSM, FIGS. 8A-8C illustrate how embodiments of the TRSSE could be arranged in the TMRSM 10 shown in FIG. 1. As illustrated in FIG. 8A, the SSE(I) of a TRSSE' is within the SSC of the pipeline stage 14A. The SSE(II) of the TRSSE' is within the SSC of the pipeline stage 14B. The SSE(III) of the TRSSE' is within the SSC of the pipeline stage 14C. As illustrated in FIG. 8B, the SSE(I) of a TRSSE" is within the SSC of the pipeline stage 16A. The SSE(II) of the TRSSE" is within the SSC of the pipeline stage 16B. The SSE(III) of the TRSSE" is within the SSC of the pipeline stage 16C. As illustrated in FIG. 8C, the SSE(I) of a TRSSE'" is within the SSC of the pipeline stage 18A. The SSE(II) of the TRSSE'" is within the SSC of the pipeline stage 18B. The SSE(III) of the TRSSE'" is within the SSC of the pipeline stage 18C.

Figure 9:
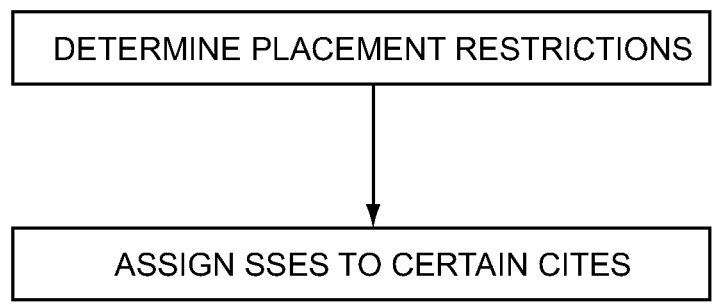
FIG. 9 illustrates exemplary procedures for determining the physical placement of TRSSEs.

Referring now to FIG. 9, exemplary procedures are provided for determining the physical placement of a TRSSE using a computer-aided design flow. The first part of the design flow is to determine placement restrictions for SSE cells within the cell rows. This may be implemented in a .lef file by assigning SSEs to a certain site. The normal standard cells may be in a "coreSite" with the pitch defined near the top of the .lef file as 1× wire pitch in a horizontal direction and the cell height of Y. However, a horizontal step size for a sequential state circuit element is at least 3×N number of wire pitches.

Figure 10:
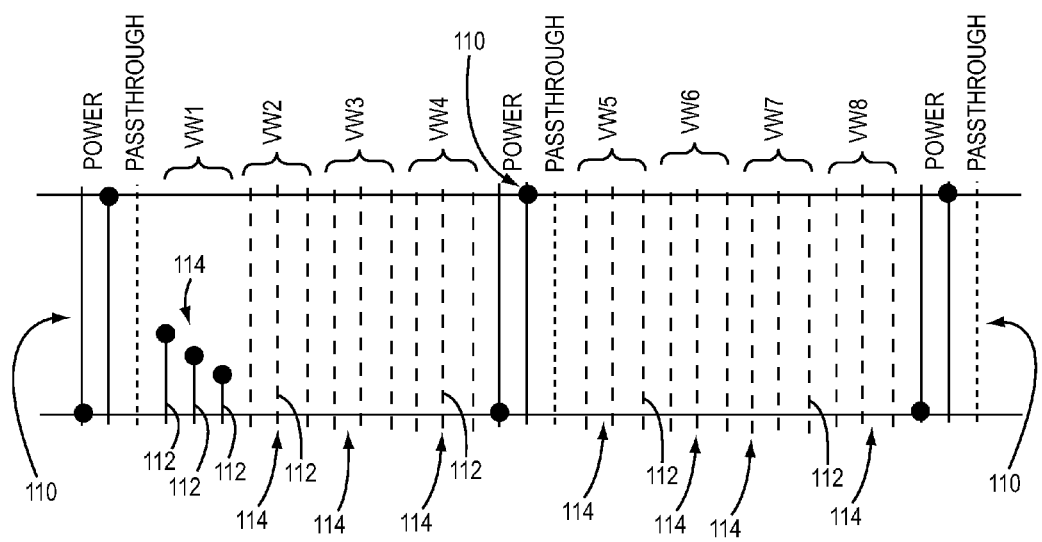
FIG. 10 illustrates an exemplary voting wiring plan for a stack of TRSSEs.

FIG. 10 illustrates one embodiment of a wire plan 108 for power wires 110 and routes for voting wires 112. The wire plan 108 should have a voting wire with at least 3× a number N of voting wires 112. In this manner, there are at least a set 114 of three voting wires 112 reserved for voting configured SSEs in a stack of N. In this example, there are 4 power wires and 2 pass-through spots for a total of 30 wire pitches. These placement restrictions help support the placement of the SSE within the TMRSM semiconductor layout. As shown in FIG. 10, a first set VW1 is reserved for one SSE layout cell. A second set VW2 is reserved for another SSE layout cell. A third set VW3 is reserved for another SSE cell layout. A fourth set VW4 is reserved for another SSE cell layout. A fifth set VW5 is reserved for another SSE cell layout. A sixth set VW6 is reserved for another SSE cell layout. A seventh set VW7 is reserved for another SSE cell layout. An eighth set VW8 is reserved for another SSE cell layout.

Figure 11:
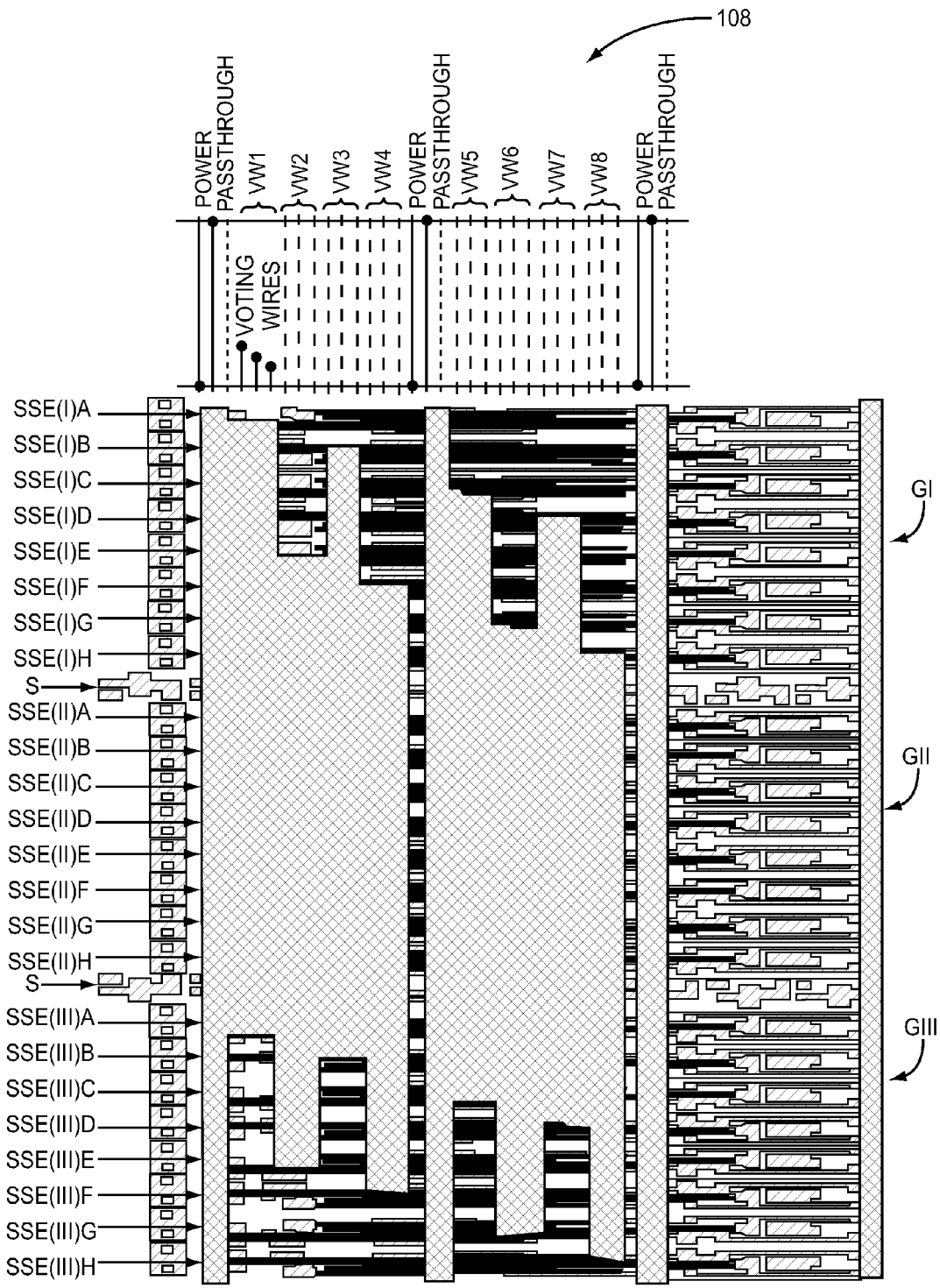
FIG. 11 illustrates the stack of TRSSEs along with the voting wiring plan.

FIG. 11 illustrates a macro block layout of eight TRSSEs stacked as a plurality of twenty-six cell rows since filler cell rows S have been added. TRSSE(A) has an SSE(I)A, an SSE(II)A, and an SSE(III)A. The 3 voting wires for the TRSSE(A) connect through the set of wire pitches VW1. TRSSE (B) has an SSE(I)B, an SSE(II)B, and an SSE(III)B. The 3 voting wires for the TRSSE(B) connect through the set of wire pitches VW2. TRSSE(C) has an SSE(I)C, an SSE(II)C, and an SSE(III)C. The 3 voting wires for the TRSSE(C) connect through the set of wire pitches VW3. TRSSE(D) has an SSE(I)D, an SSE(II)D, and an SSE(III)D. The 3 voting wires for the TRSSE(D) connect through the set of wire pitches VW4. TRSSE(E) has an SSE(I)E, an SSE(II)E, and an SSE(III)E. The 3 voting wires for the TRSSE(E) connect through the set of wire pitches VW5. TRSSE(F) has an SSE (I)F, an SSE(II)F, and an SSE(III)F. The 3 voting wires for the TRSSE(F) connect through the set of wire pitches VW6. TRSSE(G) has an SSE(I)G, an SSE(II)G, and an SSE(III)G. The 3 voting wires for the TRSSE(G) connect through the set of wire pitches VW7. TRSSE(H) has an SSE(I)H, an SSE(II) H, and an SSE(III)H. The 3 voting wires for the TRSSE(H) connect through the set of wire pitches VW8. Although not illustrated accurately in FIG. 11, the SSEs and may be sized to be about 58 wire pitches or almost twice the wire plan width of the wire plan 108. Each stack GI, GII, and GIII of eight SSEs is separated from the other stack GI, GII, GIII by a spacer cell to ensure that a single ionizing radiation particle cannot affect multiple stacks GI, GII, and GIII. The SSE versions in GI have been laid out to comply with critical node spacing restrictions. The SSE versions in GII have been laid out to comply with critical node spacing restrictions. The SSE versions in GIII have been laid out to comply with critical node spacing restrictions.

The wiring plan 108 plan thus reserves a set of wire pitches VW for each TRSSE depending on its row placement. If the wiring plan were implemented across the whole semiconductor layout and SSEs were horizontally restricted to be placed within the cell row in a horizontal multiple of the wire plan width, then selecting an SSE would be a matter of knowing a cell row position of the SSE and using the appropriate version of the SSE for that cell row.

Figure 12:
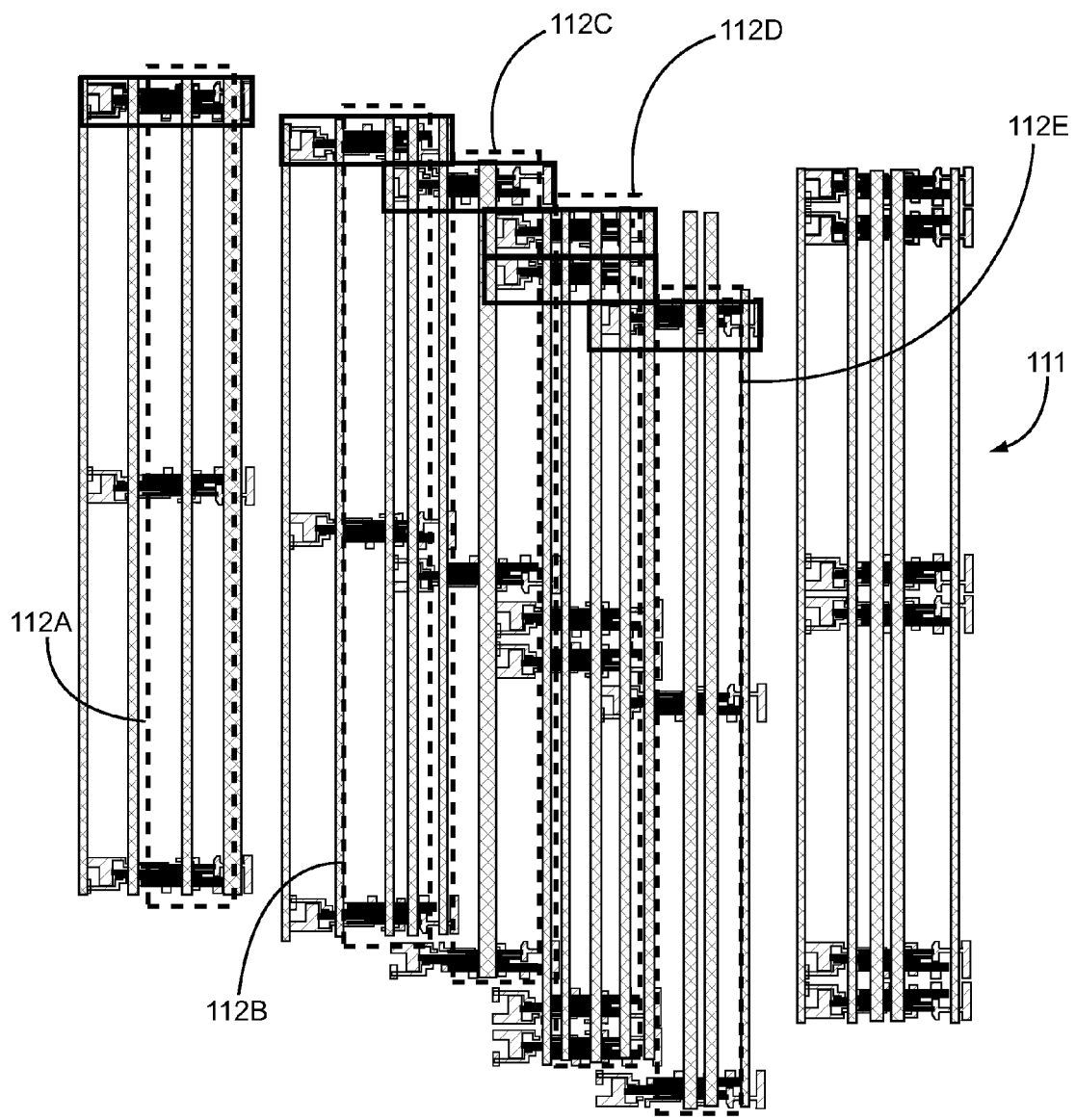
FIG. 12 illustrates a physical semiconductor layout having intermixed combination logic and TRSSEs placed in voting tracks configured in accordance with the voting wiring plan of FIG. 10.

FIG. 12 is a physical semiconductor layout 111 of a TMRSM that illustrates this concept. Each of the dashed boxes represents a wiring track 112A, 112B, 112C, 112D, 112E, implemented in accordance with the wire voting plan. By horizontally restricting placement of the SSEs within the cell row in a horizontal multiple of the wire plan width and selecting the appropriate row-dependent SSE, noninterfering vote wire track routing is ensured.

Figure 13:
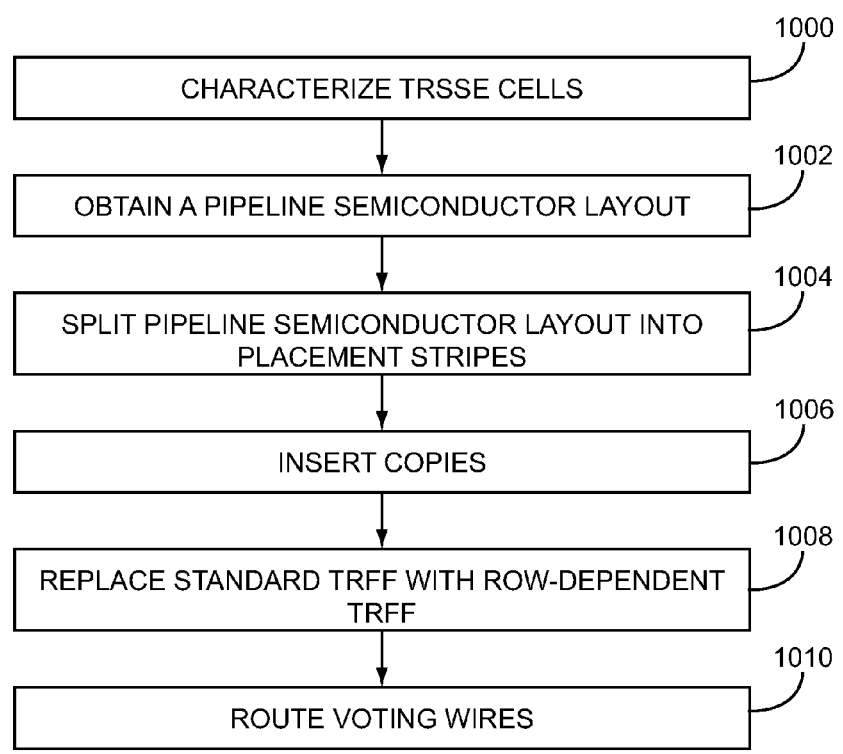
FIG. 13 illustrates exemplary procedures in one embodiment of a physical design process for physically designing a TMRSM on a semiconductor substrate.

FIG. 13 illustrates exemplary procedures in one embodiment of a physical design process for physically designing a TMRSM on a semiconductor substrate. First, TRSSE cells may be characterized by Cadence® Encounter® Library Characterizer (ELC) so that critical node requirements are met (procedure 1000). The ELC may simulate the TRSSE cells with different input and output drives and loads. In this example, the TRSSE cells are TR flip-flops (TRFFs). The resulting input slope and output capacitance are written to the .lib file required by a synthesis tool. Most TRFFs, being non-standard, complicate the characterization. For example, the delays in TRFFs are often not properly handled and incorrectly determined, and they may need to be adjusted by post-processing a .lib file. Providing the TRFFs needlessly complicates the CAD flow, since the feedback for the slave latches is unimportant, so long as the feedback delay does not exceed half the clock cycle. A stand-in single redundant cell without the latch feedback is thus used for characterization for initial placement.

Next, a pipeline semiconductor layout of a single redundant state machine (SRSM) arranged within a plurality of cell rows is obtained (procedure 1002). To produce the pipeline semiconductor layout, a synthesis tool (for example the Cadence RTL Compiler) may first be used to compile hardware design language (HDL) code to create a (non-redundant) netlist logically describing the SRSM. Both the original HDL code and the synthesis output the pipeline semiconductor layout of the SRSM, and thus no knowledge of the triple-mode redundancy is necessary in order for the compiler to operate. Consequently, standard soft intellectual property (IP), such as soft-cores, can be used and the synthesis methods are exactly the same as for non-TMRSMs. Since the synthesis is non-redundant, the TRFF cell version without the voting slave latch feedback path is used, as mentioned above. A floor plan then describes physical dimensions of the SRSM. The floor plan defines a vertical voting wire pitch and a horizontal step size that is set to at least 3 times a number N (i.e., 4 or 8) of the vertical voting wire pitches, or more particularly the wire plan width. The floor plan further defines a cell row height and a vertical step size that is set in accordance with the cell row height. The netlist places combinational logic within the plurality of cell rows such that SSE cells are vertically interleaved with combinational logic.

Figure 14:
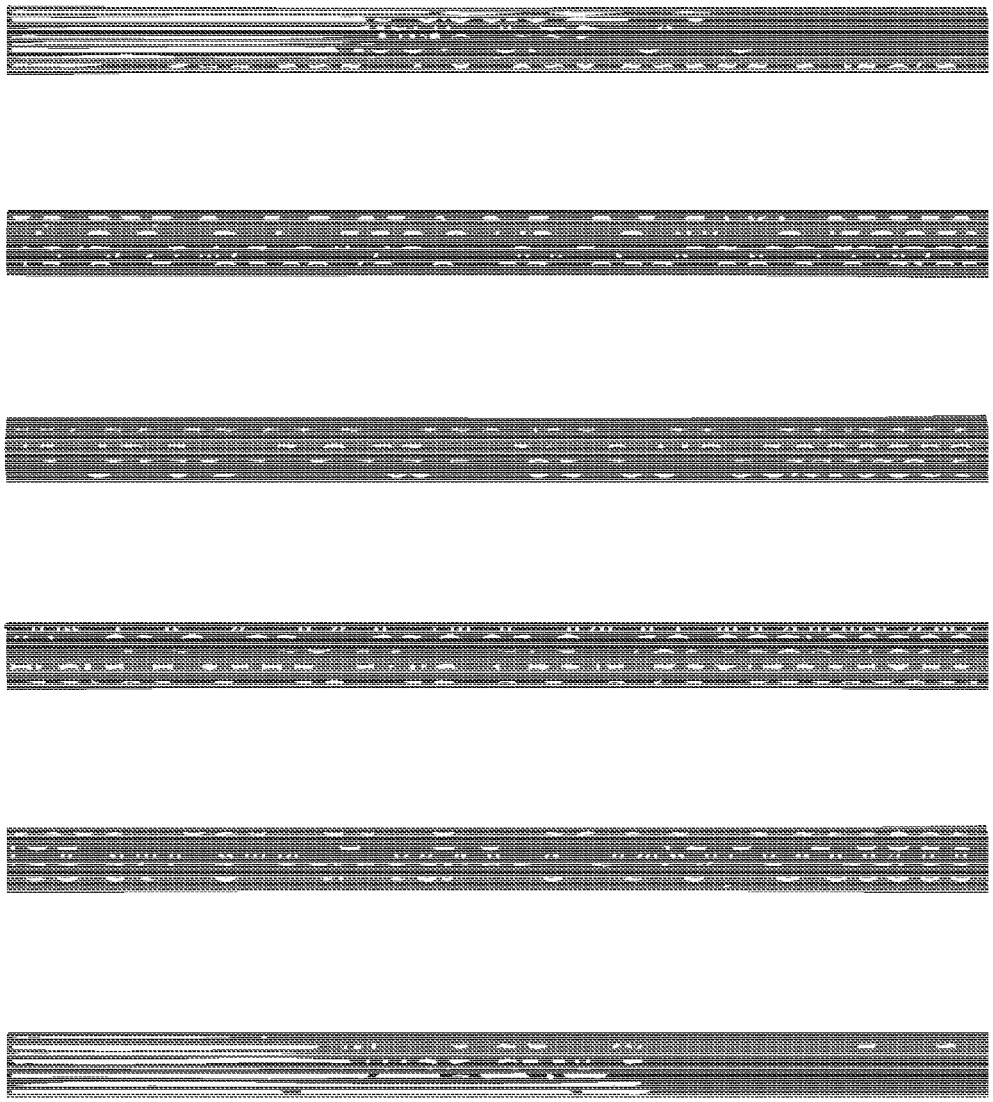
FIG. 14 illustrates a physical semiconductor layout split by the insertion of placement stripes.

Subsequently, the pipeline semiconductor layout is split into pipeline block layout stripes having a total of a number, N, of the plurality of cell rows by inserting placement stripes into the pipeline semiconductor layout (procedure 1004). This is shown in FIG. 14. In FIG. 14, the number is 8. Alternatively, the number may be 4. Each of the placement stripes has at least N empty cell rows wherein for each pipeline block layout stripe of the pipeline block layout stripes, two adjacent placement stripes of the placement stripes are designated to the pipeline block layout stripe. In FIG. 14, the placement stripes are N+1 empty cell rows, or more specifically 9 empty cell rows.

For each of the pipeline block layout stripes, a copy of the pipeline block layout stripe is inserted into one of the two adjacent placement stripes that are designated to the pipeline block layout stripe and another copy of the pipeline block layout stripe is inserted into another of the two adjacent placement stripes that are designated to the pipeline block layout stripe (procedure 1006). In the transition step, the floor plan, the cell placement, and the netlist are all modified to be TMR. In the floor plan the empty rows are populated with the redundant logic modules. The netlist and the placement are both adjusted so that combinational logic is triplicated and copied to the identical placement nine cell heights from each other. TRFF cells are connected to their respective combinational logic inputs and outputs. However, vote routing is not performed.

Figure 15:
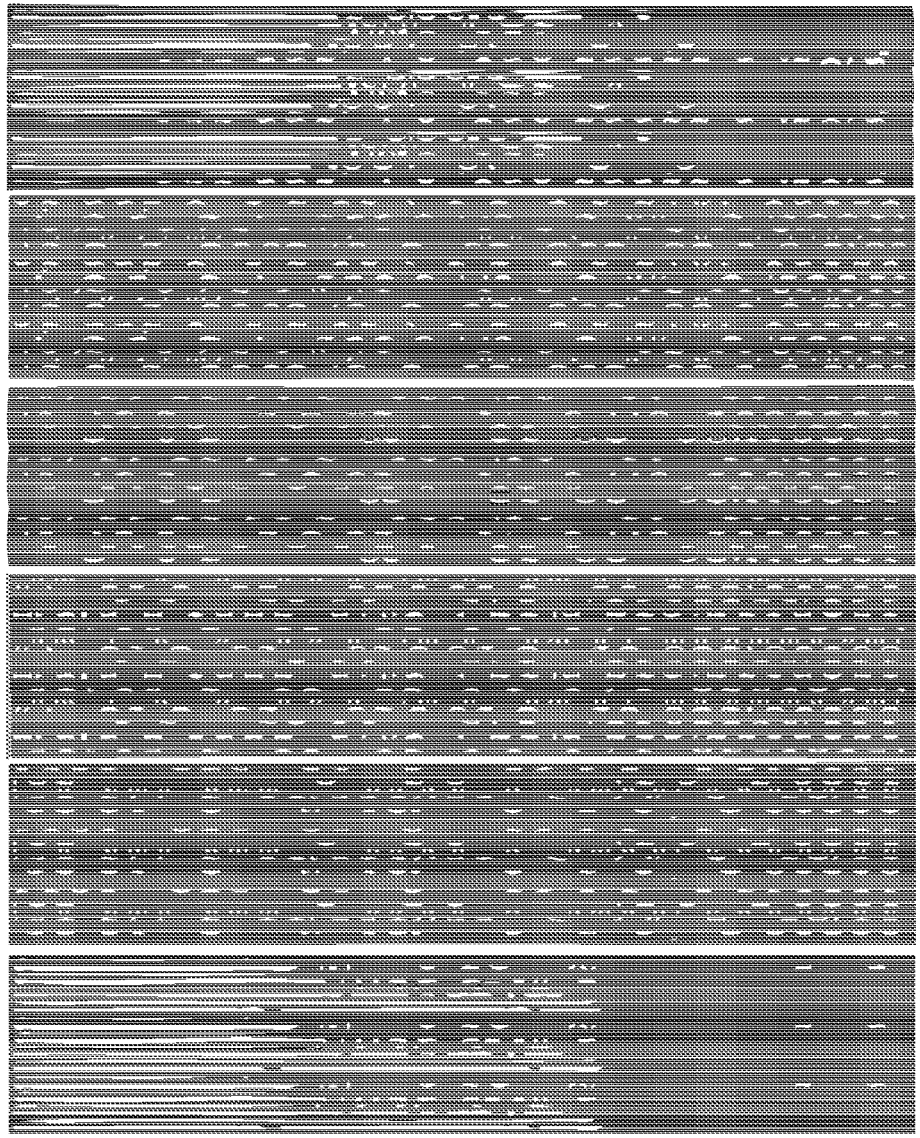
FIG. 15 illustrates the physical semiconductor layout provided with copies placed into the placement stripes.

Next, TRFF cells are replaced with one of a set of N row-dependent sequential element cells (procedure 1008). These were described with respect to FIG. 11. Note that since there are 9 cell rows separating the copies, one of the row-dependent sequential element cells is flipped because of the inverted logic implemented. Finally, the voting wires are routed (procedure 1010). Post-verification may also be performed. An exemplary embodiment of a final layout is shown in FIG. 15.

Next, the horizontal position of the TRSCMSFF cells in the block as placed is used to select the proper layout) version of each TRSCMSFF cell. The netlist is then modified to ensure matching to the correct physical version; cell and net names are also modified accordingly. After these modifications are complete, the logic is fully TMR and the TRSCMSFFs are used throughout (both self-correcting and non-self-correcting transparent latches can also be used). Since the only parts of a circuit that need to maintain critical node spacing against charge collection are the transistor sources and drains, the routed wires have no radiation-hardening restrictions and standard methods may be used. Those skilled in the art will recognize improvements and modifications to the preferred embodiments of the present disclosure. All such improvements and modifications are considered within the scope of the concepts disclosed herein and the claims that follow.

What is claimed is:

1. A sequential state element synchronizable in accordance with a clock signal that oscillates between a first clock state and a second clock state, the sequential state element comprising:
    a first sampling stage configured to sample a first input bit signal having a first input bit state and generate a first output bit signal having a first output bit state provided in accordance with the first input bit state while the clock signal is in the first clock state;
    a first feedback stage operable in a first feedback mode and a second feedback mode, wherein the first feedback stage is configured to drive the first output bit state of the first output bit signal while the clock signal is in the second clock state such that the first output bit state of the first output bit signal is held as provided from the first sampling stage when the first feedback stage is in the first feedback mode and the first output bit state is held in accordance to a majority bit state of a first feedback input bit signal that provides feedback for the first output bit signal, a second feedback input bit signal, and a third feedback input bit signal when the first feedback stage is in the second feedback mode.

2. The sequential state element of claim 1, further comprising:
    a multiplexer configured to:
        receive a multiplexer select signal, a first data bit signal, and a second data bit signal;
        provide an initial input bit signal; and
        select between the first data bit signal and the second data bit signal as the initial input bit signal in response to the multiplexer select signal;
    the first sampling stage being operably associated with the multiplexer such that the first input bit signal is based on the initial input bit signal.

3. The sequential state element of claim 2, wherein the multiplexer is configured to:
    receive the first data bit signal as a data line bit signal;
    receive the second data bit signal as a scan mode bit signal; and
    receive the multiplexer select signal as a scan enable signal.

4. The sequential state element of claim 1, wherein the first sampling stage and the first feedback stage are configured as a first latch.

5. The sequential state element of claim 4, further comprising:
    a master latch coupled to the first latch so that the first latch is a slave latch, the master latch is configured to:
        sample an initial input bit signal having an initial input bit state to generate the first input bit signal while the clock signal is in the second clock state, wherein the first input bit state is based on the initial input bit state; and
        hold the initial input bit state of the first input bit signal while the clock signal is in the first clock state.

6. The sequential state element of claim 5 wherein the master latch further comprises:
    a second sampling stage configured to sample the initial input bit signal and generate an intermediary output bit signal having an intermediary output bit state based on the initial input bit state while the clock signal is in the second clock state, wherein the first input bit state of the first input bit signal is related to the intermediary output bit state of the intermediary output bit signal; and
    a second feedback stage configured to drive the intermediary output bit state of the intermediary output bit signal such that the intermediary output bit state is held as provided from the second sampling stage while the clock signal is in the first clock state.

7. The sequential state element of claim 5, wherein the master latch and the slave latch are coupled so that the sequential state element comprises a flip-flop.

8. The sequential state element of claim 5, wherein the master latch further comprises an inverter configured to receive the intermediary output bit signal and generate the first input bit signal such that the first input bit state is an inverse of the intermediary output bit state.

9. The sequential state element of claim 4, further comprising:
    a second latch configured to generate the second feedback input bit signal;
    a third latch configured to generate the third feedback input bit signal;
    the first feedback stage being configured to receive the second feedback input bit signal from the second latch and the third feedback input bit signal from the third latch.

10. The sequential state element of claim 9, wherein:
    the second latch comprises:
        a second sampling stage configured to sample a second input bit signal having a second input bit state and generate a second output bit signal having a second output bit state provided in accordance with the second input bit state while the clock signal is in the first clock state; and
        a second feedback stage configured to drive the second output bit state of the second output bit signal while the clock signal is in the second clock state, wherein the second feedback stage is operable to provide the second feedback input bit signal as feedback for the second output bit signal; and
    the third latch comprises:
        a third sampling stage configured to sample a third input bit signal having a third input bit state and generate a third output bit signal having a third output bit state provided in accordance with the third input bit state while the clock signal is in the first clock state; and a third feedback stage configured to drive the third output bit state of the third output bit signal while the clock signal is in the second clock state, wherein the third feedback stage is operable to provide the third feedback input bit signal as feedback for the third output bit signal.

11. The sequential state element of claim 10, wherein:
the second feedback stage is operable in the first feedback mode and in the second feedback mode, the second feedback stage is configured to drive the second output bit state of the first output bit signal while the clock signal is in the second clock state such that the second output bit state of the second output bit signal is held as provided from the second sampling stage when the second feedback stage is in the first feedback mode and the second output bit state is held in accordance to the majority bit state of the first feedback input bit signal, the second feedback input bit signal, and the third feedback input bit signal when the second feedback stage is in the second feedback mode;
the third feedback stage is operable in the first feedback mode and in the second feedback mode, the third feedback stage is configured to drive the third output bit state of the third output bit signal while the clock signal is in the second clock state such that the third output bit state of the third output bit signal is held as provided from the third sampling stage when the third feedback stage is in the first feedback mode and the third output bit state is held in accordance to the majority bit state of the first feedback input bit signal, the second feedback input bit signal, and the third feedback input bit signal when the third feedback stage is in the second feedback mode.

12. The sequential state element of claim 10, further comprising:
a first multiplexer configured to:
receive a multiplexer select signal, a first data bit signal, and a second data bit signal;
generate a first initial input bit signal; and
select between the first data bit signal and the second data bit signal as the first initial input bit signal based on the multiplexer select signal;
a second multiplexer configured to:
receive the multiplexer select signal, a third data bit signal, and a fourth data bit signal;
generate a second initial input bit signal; and
select between the third data bit signal and the fourth data bit signal as the second initial input bit signal based on the multiplexer select signal;
a third multiplexer configured to:
receive the multiplexer select signal, a fifth data bit signal, and a sixth data bit signal;
generate a third initial input bit signal; and
select between the fifth data bit signal and the sixth data bit signal as the third initial input bit signal based on the multiplexer select signal;
the first sampling stage being operably associated with the first multiplexer such that the first input bit signal is based on the first initial input bit signal;
the second sampling stage being operably associated with the second multiplexer such that the second input bit signal is based on the second initial input bit signal; and
the third sampling stage being operably associated with the third multiplexer such that the third input bit signal is based on the third initial input bit signal.

13. The sequential state element of claim 1, further comprising an inverter configured to receive the first output bit signal from the first sampling stage and generate the first feedback input bit signal having a feedback bit state that is inverted with respect to the first output bit state of the first output bit signal.

14. The sequential state element of claim 13, further comprising a second inverter configured to receive the first output bit signal at a storage node and generate a final output bit signal having a final output bit state that is inverted with respect to the first output bit state of the first output bit signal.

15. The sequential state element of claim 1, wherein the first feedback stage is configured to generate a feedback output bit signal at a feedback output bit state so as to drive the first output bit state of the first output bit signal while the clock signal is in the second clock state, wherein:
the first feedback stage is operable in the first feedback mode to set the feedback output bit state in accordance with the first output bit state of the first output bit signal; and
the first feedback stage is operable in the second feedback mode to set the feedback output bit state in accordance to the majority bit state of the first feedback input bit signal, the second feedback input bit signal, and the third feedback input bit signal.

16. The sequential state element of claim 15, wherein the first feedback stage is further configured to:
receive a feedback mode signal, wherein the feedback mode signal is provided at a first signal level to indicate the first feedback mode and at a second signal level to indicate the second feedback mode;
operate in the first feedback mode when the feedback mode signal is provided at the first signal level; and
operate in the second feedback mode when the feedback mode signal is provided at the second signal level.

17. The sequential state element of claim 16, wherein the first feedback stage comprises a majority gate configured to:
activate in response to the feedback mode signal being provided at the second signal level;
receive the first feedback input bit signal, the second feedback input bit signal, and the third feedback input bit signal;
set the feedback output bit state in accordance to the majority bit state of the first feedback input bit signal, the second feedback input bit signal, and the third feedback input bit signal while the clock signal is in the first clock state; and
deactivate in response to the feedback mode signal being provided at the first signal level.

18. The sequential state element of claim 17, wherein the first feedback stage comprises a tristate gate configured to:
activate in response to the feedback mode signal being provided at the first signal level;
set the feedback output bit state of the feedback output bit signal in accordance with only a first feedback input bit state of the first feedback input bit signal while the clock signal is in the second clock state; and
deactivate in response to the feedback mode signal being provided at the second signal level.

19. The sequential state element of claim 16, further comprising:
a multiplexer configured to:
receive a multiplexer select signal, a first data bit signal, and a second data bit signal;
generate an initial input bit signal; and
select between the first data bit signal and the second data bit signal as the initial input bit signal based on the multiplexer select signal;

the first sampling stage being operably associated with the multiplexer such that the first input bit signal is based on the initial input bit signal; and the first feedback stage being configured to receive the multiplexer select signal as the feedback mode signal.

20. The sequential state element of claim 19, wherein the multiplexer is configured to:

receive the first data bit signal as a data line bit signal;

receive the second data bit signal as a scan mode bit signal; and receive the multiplexer select signal as a scan enable signal.

21. The sequential state element of claim 16, further comprising:

a multiplexer configured to:

receive a multiplexer select signal, a first data bit signal, and a second data bit signal;

generate an initial input bit signal; and select between the first data bit signal and the second data bit signal as the initial input bit signal based on the multiplexer select signal; and the first sampling stage being operably associated with the multiplexer such that the first input bit signal is based on the initial input bit signal; and the first feedback stage is configured to receive the feedback mode signal independently of the multiplexer select signal.

22. The sequential state element of claim 1, wherein the first feedback stage is configured to drive the first output bit state of the first output bit signal when the first feedback stage is in the second feedback mode such that the first output bit state of the first output bit signal is held as an inverse of the majority bit state of the first feedback input bit signal, the second feedback input bit signal, and the third feedback input bit signal.

\* \* \* \* \*